(12) United States Patent
Yamashita

(10) Patent No.: US 10,784,304 B2
(45) Date of Patent: *Sep. 22, 2020

(54) SOLID-STATE IMAGING APPARATUS, AND ELECTRONIC APPARATUS

(71) Applicant: SONY SEMICONDUCTOR SOLUTIONS CORPORATION, Kanagawa (JP)

(72) Inventor: Kazuyoshi Yamashita, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/261,154

(22) Filed: Jan. 29, 2019

(65) Prior Publication Data
US 2019/0172869 A1 Jun. 6, 2019

Related U.S. Application Data

(63) Continuation of application No. 15/554,739, filed as application No. PCT/JP2016/057279 on Mar. 9, 2016, now Pat. No. 10,431,662.

(30) Foreign Application Priority Data

Mar. 23, 2015 (JP) ................. 2015-059419

(51) Int. Cl.
H01L 27/146 (2006.01)
H04N 5/374 (2011.01)
(Continued)

(52) U.S. Cl.
CPC ...... *H01L 27/14656* (2013.01); *H01L 27/146* (2013.01); *H01L 27/14603* (2013.01);
(Continued)

(58) Field of Classification Search
CPC .......... H01L 27/3211; H01L 27/14641; H01L 27/3216; H01L 27/3218; H01L 27/127;
(Continued)

(56) References Cited

U.S. PATENT DOCUMENTS 6,188,093 B1 2/2001 Isogai et al.
8,520,105 B2* 8/2013 Funatsu ............ H01L 27/14609
348/280
(Continued)

FOREIGN PATENT DOCUMENTS

BR PI1002395 A2 2/2014
CN 101800861 A 8/2010
(Continued)

OTHER PUBLICATIONS

Notice of Allowance for U.S. Appl. No. 15/554,739, dated Oct. 24, 2018, 31 pages.
(Continued)

*Primary Examiner* — Chuong A Luu
(74) *Attorney, Agent, or Firm* — Chip Law Group

(57) ABSTRACT

Provided is a solid-state imaging apparatus that is formed so that, in a pixel array unit in which combinations of a first pixel corresponding to a color component of a plurality of color components and a second pixel having higher sensitivity to incident light as compared with the first pixel are two-dimensionally arrayed, a first electrical barrier formed between a first photoelectric conversion unit and a first unnecessary electric charge drain unit in the first pixel, and a second electrical barrier formed between a second photoelectric conversion unit and a second unnecessary electric charge drain unit in the second pixel have different heights, respectively.

7 Claims, 20 Drawing Sheets

(51) Int. Cl.
*H04N 9/07* (2006.01)
*H04N 5/359* (2011.01)
*H04N 5/369* (2011.01)

(52) U.S. Cl.
CPC ....... *H01L 27/14612* (2013.01); *H04N 5/359* (2013.01); *H04N 5/3592* (2013.01); *H04N 5/369* (2013.01); *H04N 5/374* (2013.01); *H04N 9/07* (2013.01); *H01L 27/14623* (2013.01)

(58) Field of Classification Search
CPC ......... H01L 27/14609; H01L 27/14643; H01L 27/1464; H01L 27/148; H01L 27/146; H01L 27/14656; H01L 27/14603; H01L 27/14612; H01L 27/14623; H04N 5/225; H04N 5/228; H04N 5/335; H04N 5/359; H04N 5/3592; H04N 5/369; H04N 5/374; H04N 9/07
USPC ........................................................ 257/230
See application file for complete search history.

(56) References Cited

U.S. PATENT DOCUMENTS

| 10,431,622 | B2* | 10/2019 | Yamashita | ........ H01L 27/14603 |
| 2004/0051801 | A1 | 3/2004 | Lizuka et al. | |
| 2010/0134648 | A1 | 6/2010 | Funatsu et al. | |
| 2010/0141819 | A1 | 6/2010 | Fowler et al. | |
| 2011/0007201 | A1 | 1/2011 | Yoshioka | |
| 2013/0308008 | A1 | 11/2013 | Funatsu et al. | |

FOREIGN PATENT DOCUMENTS

| EP | 2216820 | A2 | 8/2010 |
| JP | 2004-111590 | A | 4/2004 |
| JP | 4187004 | B2 | 11/2008 |
| JP | 4403687 | B2 | 1/2010 |
| JP | 2010-183040 | A | 8/2010 |
| JP | 2011-019123 | A | 1/2011 |
| KR | 10-2010-0091109 | A | 8/2010 |
| RU | 2010103236 | A | 8/2011 |
| TW | 201106475 | A | 2/2011 |
| TW | 201407758 | A | 2/2014 |

OTHER PUBLICATIONS

International Preliminary Report on Patentability of PCT Application No. PCT/JP2016/057279, dated Oct. 5, 2017, 8 pages of English Translation and 6 pages of IPRP.

International Search Report and Written Opinion of PCT Application No. PCT/JP2016/057279, dated Apr. 12, 2016, 2 pages of English Translation and 8 pages of ISRWO.

* cited by examiner

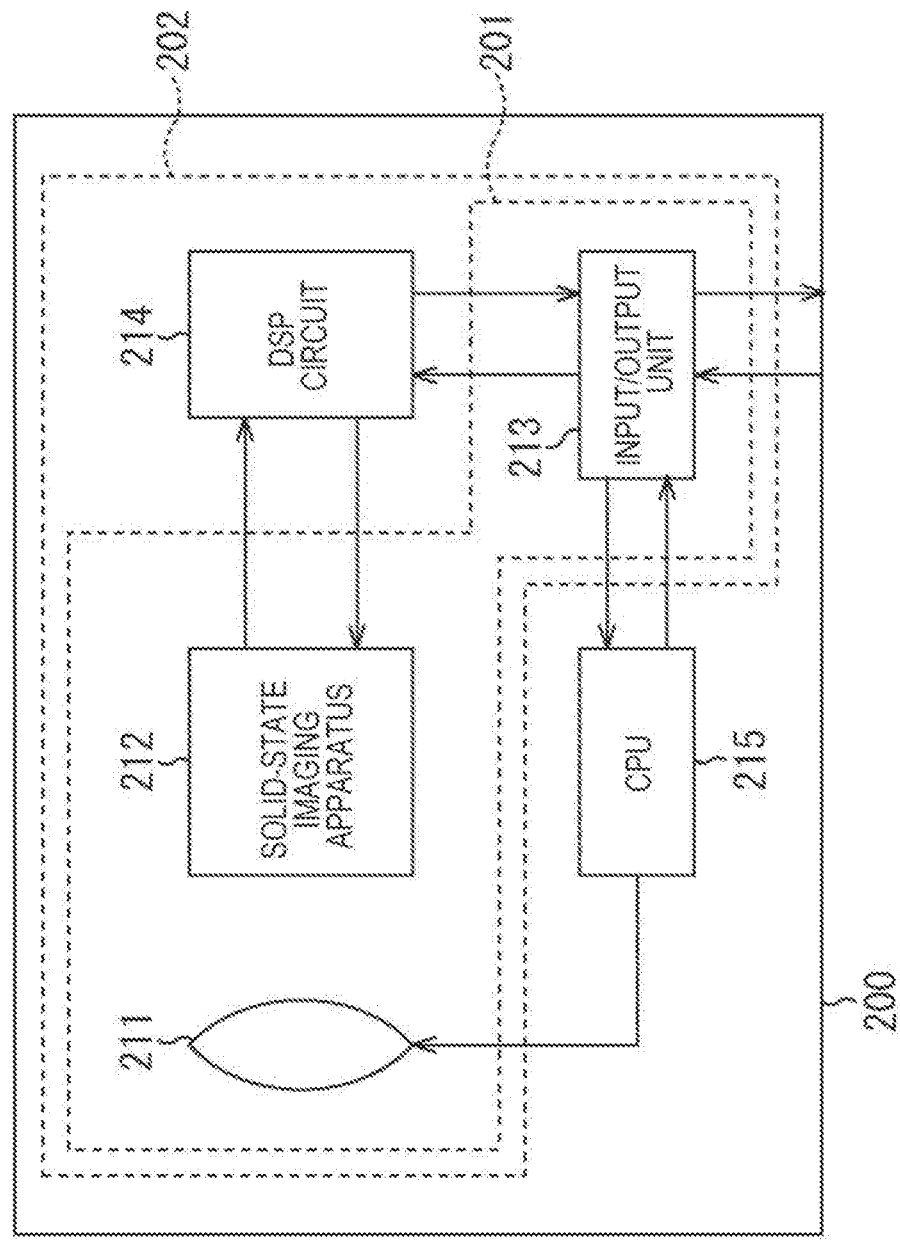

SOLID-STATE IMAGING APPARATUS, AND ELECTRONIC APPARATUS

CROSS REFERENCE TO RELATED APPLICATIONS

This application is a continuation application of U.S. patent application Ser. No. 15/554,739, filed Aug. 31, 2017, which is a National Stage of PCT/JP2016/057279, filed Mar. 9, 2016, and claims the benefit of priority from prior Japanese Patent Application JP 2015-059419, filed in the Japan Patent Office on Mar. 23, 2015. Each of the above-referenced applications is hereby incorporated herein by reference in its entirety.

TECHNICAL FIELD

The present technology relates to a solid-state imaging apparatus, and an electronic apparatus, and in particular relates to a solid-state imaging apparatus and an electronic apparatus configured to be capable of improving coloration and improving image quality.

BACKGROUND ART

Conventionally, in a solid-state imaging apparatus such as a complementary metal oxide semiconductor (CMOS) image sensor, a technology for suppressing a blooming phenomenon has been devised (for example, see Patent Document 1).

Furthermore, to obtain a brighter shot image in a dark place, a solid-state imaging apparatus including white (W) pixels in addition to red (R) pixels, green (G) pixels, and blue (B) pixels has been devised (for example, see Patent Document 2).

CITATION LIST

Patent Document

Patent Document 1: Japanese Patent No. 4403687
Patent Document 2: Japanese Patent No. 4187004

SUMMARY OF THE INVENTION

Problems to be Solved by the Invention

By the way, in a case where a pixel array including high sensitivity pixels such as W pixels are used in the solid-state imaging apparatus, a blooming phenomenon occurs since the high sensitivity pixels are saturated earlier than other pixels, and as a result, there has been an area where so-called coloration occurs in a shot image after signal processing. For that reason, there has been a demand for improving such coloration, and suppressing degradation of image quality.

The present technology has been made in view of such a situation, and makes it possible to improve coloration and improve image quality.

Solutions to Problems

A solid-state imaging apparatus of a first aspect of the present technology is a solid-state imaging apparatus including a pixel array unit in which combinations of a first pixel corresponding to a color component of a plurality of color components and a second pixel having higher sensitivity to incident light as compared with the first pixel are two-dimensionally arrayed, in which the first pixel includes: a first photoelectric conversion unit that generates electric charges according to an amount of incident light; a first unnecessary electric charge drain unit that receives unnecessary electric charges being electric charges generated by the first photoelectric conversion unit; and a first unnecessary electric charge discharge gate unit that discharges the unnecessary electric charges generated by the first photoelectric conversion unit to the first unnecessary electric charge drain unit in accordance with a height of a first electrical barrier formed between the first photoelectric conversion unit and the first unnecessary electric charge drain unit, and the second pixel includes: a second photoelectric conversion unit that generates electric charges according to an amount of incident light; a second unnecessary electric charge drain unit that receives unnecessary electric charges being electric charges generated by the second photoelectric conversion unit; and a second unnecessary electric charge discharge gate unit that discharges the unnecessary electric charges generated by the second photoelectric conversion unit to the second unnecessary electric charge drain unit in accordance with a height of a second electrical barrier formed between the second photoelectric conversion unit and the second unnecessary electric charge drain unit, and the height of the first electrical barrier and the height of the second electrical barrier are different from each other.

In the solid-state imaging apparatus of the first aspect of the present technology, the first electrical barrier formed between the first photoelectric conversion unit and the first unnecessary electric charge drain unit in the first pixel corresponding to the color component of the plurality of color components, and the second electrical barrier formed between the second photoelectric conversion unit and the second unnecessary electric charge drain unit in the second pixel having higher sensitivity to incident light as compared with the first pixel, are formed to have different heights, respectively.

An electronic apparatus of a second aspect of the present technology is an electronic apparatus mounting a solid-state imaging apparatus, the solid-state imaging apparatus including a pixel array unit in which combinations of a first pixel corresponding to a color component of a plurality of color components and a second pixel having higher sensitivity to incident light as compared with the first pixel are two-dimensionally arrayed, in which the first pixel includes: a first photoelectric conversion unit that generates electric charges according to an amount of incident light; a first unnecessary electric charge drain unit that receives unnecessary electric charges being electric charges generated by the first photoelectric conversion unit; and a first unnecessary electric charge discharge gate unit that discharges the unnecessary electric charges generated by the first photoelectric conversion unit to the first unnecessary electric charge drain unit in accordance with a height of a first electrical barrier formed between the first photoelectric conversion unit and the first unnecessary electric charge drain unit, and the second pixel includes: a second photoelectric conversion unit that generates electric charges according to an amount of incident light; a second unnecessary electric charge drain unit that receives unnecessary electric charges being electric charges generated by the second photoelectric conversion unit; and a second unnecessary electric charge discharge gate unit that discharges the unnecessary electric charges generated by the second photoelectric conversion unit to the second unnecessary electric charge drain unit in accordance with a height of a second electrical barrier formed between the second photoelectric conversion unit and the second unnecessary electric charge drain unit, and the height of the first electrical barrier and the height of the second electrical barrier are different from each other.

In the electronic apparatus of the second aspect of the present technology, the first electrical barrier formed between the first photoelectric conversion unit and the first unnecessary electric charge drain unit in the first pixel corresponding to the color component of the plurality of color components, and the second electrical barrier formed between the second photoelectric conversion unit and the second unnecessary electric charge drain unit in the second pixel having higher sensitivity to incident light as compared with the first pixel, are formed to have different heights, respectively.

Effects of the Invention

According to the first aspect and the second aspect of the present technology, coloration can be improved and image quality can be improved.

Incidentally, the effect described here is not necessarily limited, and can be any effect described in the present disclosure.

BRIEF DESCRIPTION OF DRAWINGS

FIGS. 1A and 1B are diagrams illustrating a pixel array in a case where W pixels are included in addition to RGB pixels.
FIG. 18 is a diagram illustrating a configuration example of a camera module including a solid-state imaging apparatus.

MODES FOR CARRYING OUT THE INVENTION

Figures 1A, 1B:
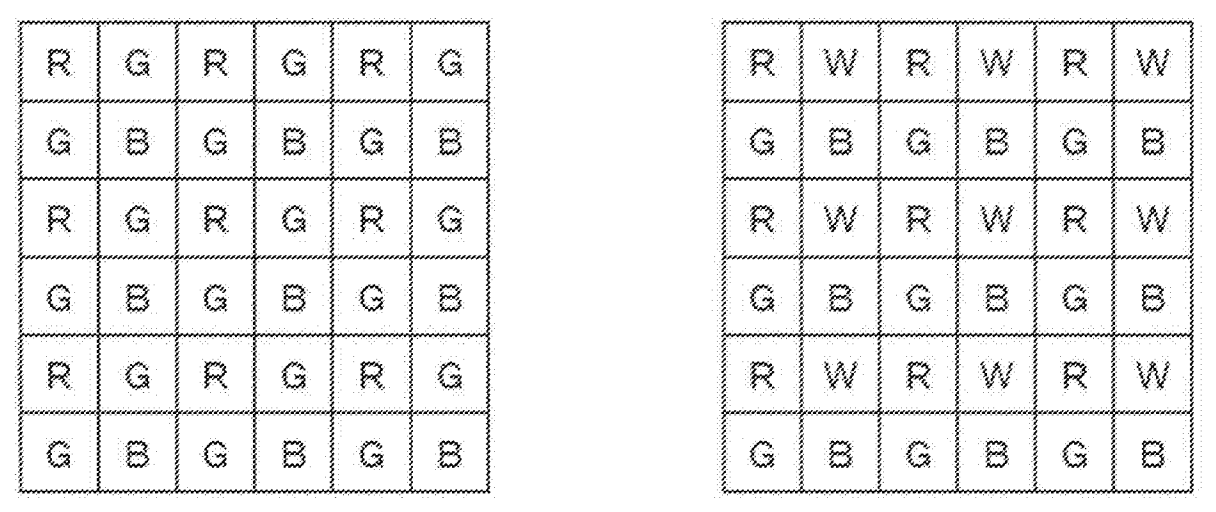
Figure 2:
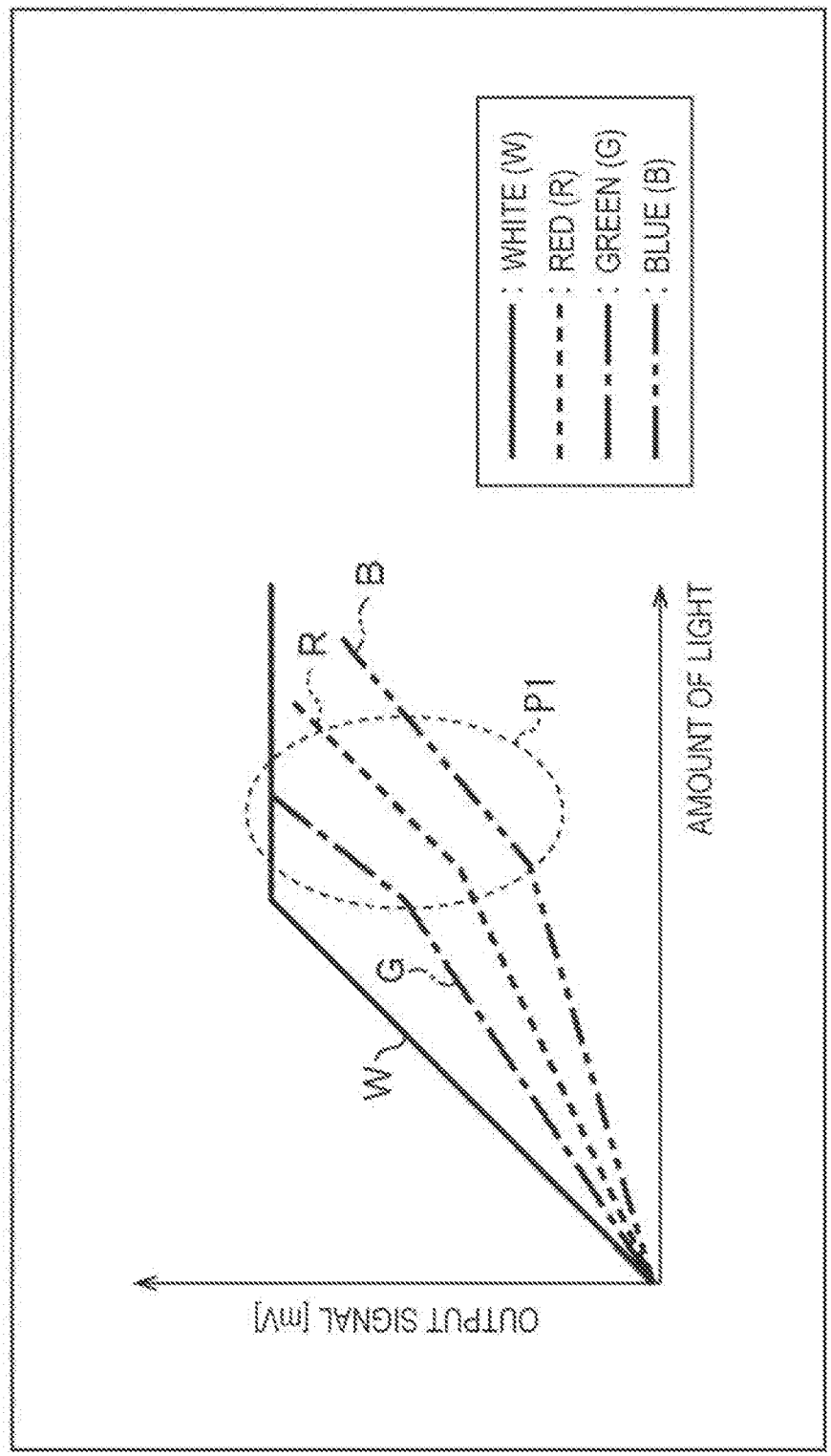
FIG. 2 is a diagram illustrating degradation of linearity due to a blooming phenomenon.

Hereinafter, embodiments of the present technology are described with reference to the drawings. Incidentally, the description is made in the following order.
1. Problem to be solved by present technology
2. Configuration of solid-state imaging apparatus
3. First embodiment: OFG voltage control
4. Second embodiment: OFD voltage control
5. Third embodiment: OFG gate size and impurity concentration adjustment
6. Fourth embodiment: structure including memory unit
7. Modification
8. Configuration of camera module
9. Configuration of electronic apparatus
10. Examples of use of solid-state imaging apparatus 1. Problem to be Solved by Present Technology FIGS. 1A and 1B are diagrams illustrating a pixel array in a case where W pixels are included in addition to RGB pixels.

FIG. 1A illustrates a pixel array of a Bayer array, and the G pixels are placed in a checkered pattern, and the R pixels and the B pixels are alternately placed for each row in remaining portions. FIG. 1A, the W pixels are added to the RGB pixels, whereby a brighter shot image is obtained even in, for example, a dark place. In the pixel array of FIG. 1B, rows in which the R pixels and the W pixels are alternately placed and rows in which the G pixels and the B pixels are alternately placed are alternately placed for each row.

In such a pixel array including the W pixels (FIG. 1B), since the W pixels as high sensitivity pixels are saturated earlier than other pixels, electric charges overflow to other adjacent pixels from the W pixels, and a blooming phenomenon may occur. Herein, in FIG. 2, a relationship among the pixels is illustrated in a case where the horizontal axis is an amount of light and the vertical axis is an output signal, and linearity is maintained in W pixels, but in G pixels, R pixels, and B pixels, if the blooming phenomenon occurs, linearity cannot be maintained from the middle, and linearity is degraded (an area P1 in a dotted line of FIG. 2).

Then, if linearity is degraded due to the blooming phenomenon, in signal processing by a subsequent signal processing circuit, in an area where linearity is degraded of a high illuminance side in the G pixels, the R pixels, and the B pixels, a ratio of white balance fluctuates as compared with an area where linearity is maintained, so that coloration occurs in the shot image. When such coloration occurs, degradation of image quality of the shot image occurs.

Figure 3:
FIG. 3 is a diagram illustrating a pixel array including W pixels corresponding to a potential structure of FIGS. 4A and 4B.

In this way, a problem of the coloration is due to the blooming phenomenon, and is illustrated by a potential structure of a pixel, as follows. That is, when illustrating a potential structure corresponding to an R pixel and a W pixel in a portion indicated by a dotted line L in a pixel array including W pixels in FIG. 3, the potential structure can be represented as a potential diagram of FIGS. 4A and 4B.

Figure 4:
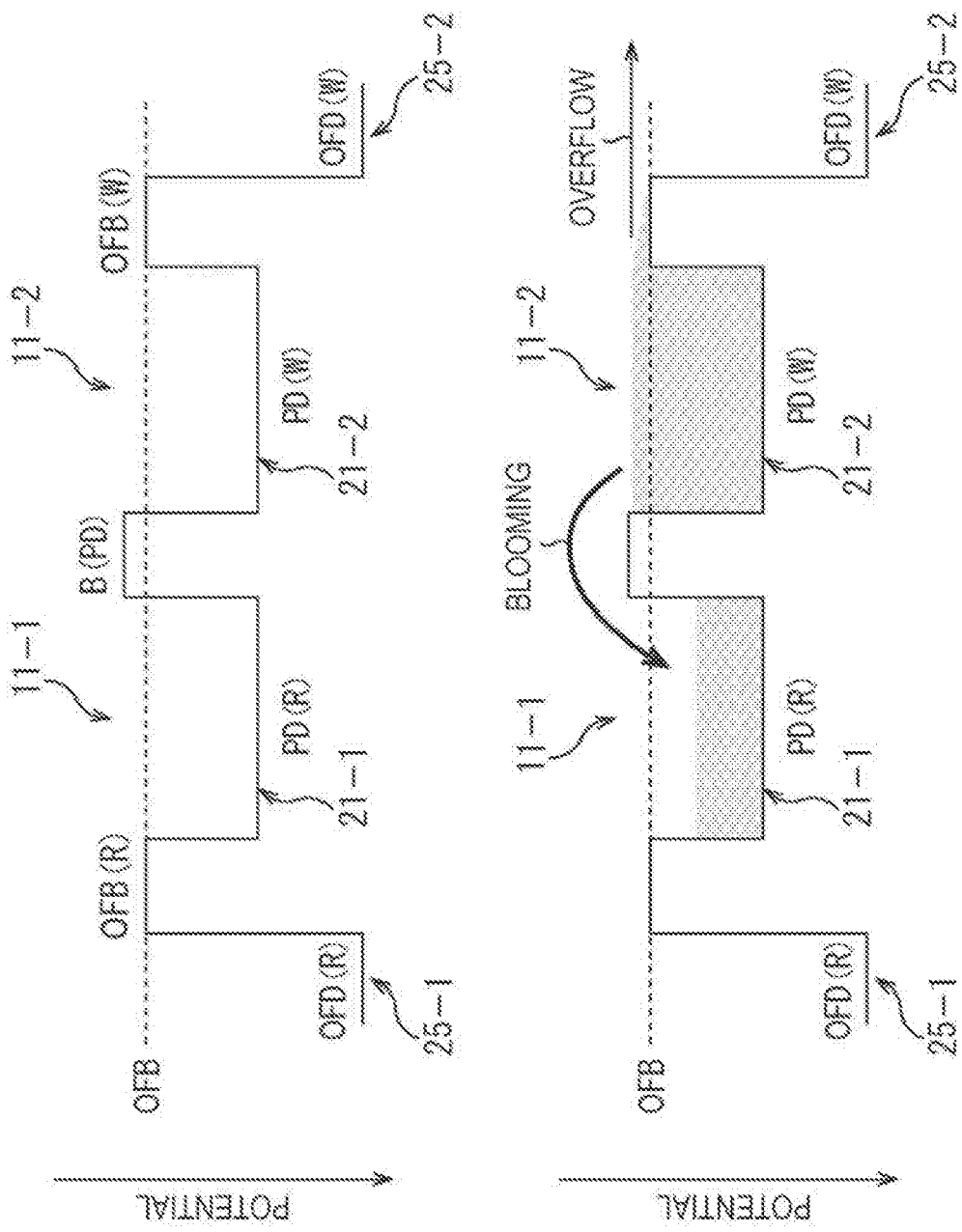
FIGS. 4A and 4B are potential diagrams for explaining the blooming phenomenon.

In FIG. 4A, in a photodiode 21-1 of an R pixel 11-1 and a photodiode 21-2 of a W pixel 11-2, electric charges according to an amount of incident light is generated, and the W pixel 11-2 having higher sensitivity as compared with the R pixel 11-1 is saturated earlier than the R pixel, so that electric charges accumulated in the photodiode 21-2 overflow to the photodiode 21-1 side and the blooming phenomenon occurs (FIG. 4B).

A cause of occurrence of the blooming phenomenon is that heights of a potential barrier (OFB(R)) and a potential barrier (OFB(W)) are formed to be deeper than the height of a potential barrier (B(PD)), but the heights of the potential barrier (OFB(R)) and the potential barrier (OFB(W)) are formed to be the same height. Focusing on this point, the present technology makes it possible to improve coloration due to the blooming phenomenon and improve image quality.

Incidentally, in FIGS. 4A and 4B, the potential barrier (OFB(R)) is an electrical barrier formed between the photodiode 21-1 and an overflow drain 25-1 in the R pixel 11-1. Furthermore, the potential barrier (OFB(W)) is an electrical barrier formed between the photodiode 21-2 and an overflow drain 25-2 in the W pixel 11-2. Furthermore, the potential barrier (B(PD)) is an electrical barrier formed between the photodiode 21-1 and the photodiode 21-2.

Furthermore, in FIGS. 4A and 4B, the blooming phenomenon has been described by exemplifying the R pixel 11-1 as a pixel adjacent to the W pixel 11-2; similarly, also in the G pixels and the B pixels adjacent to the W pixel 11-2, the blooming phenomenon occurs.

2. Configuration of Solid-State Imaging Apparatus (Configuration of Solid-State Imaging Apparatus)

Figure 5:
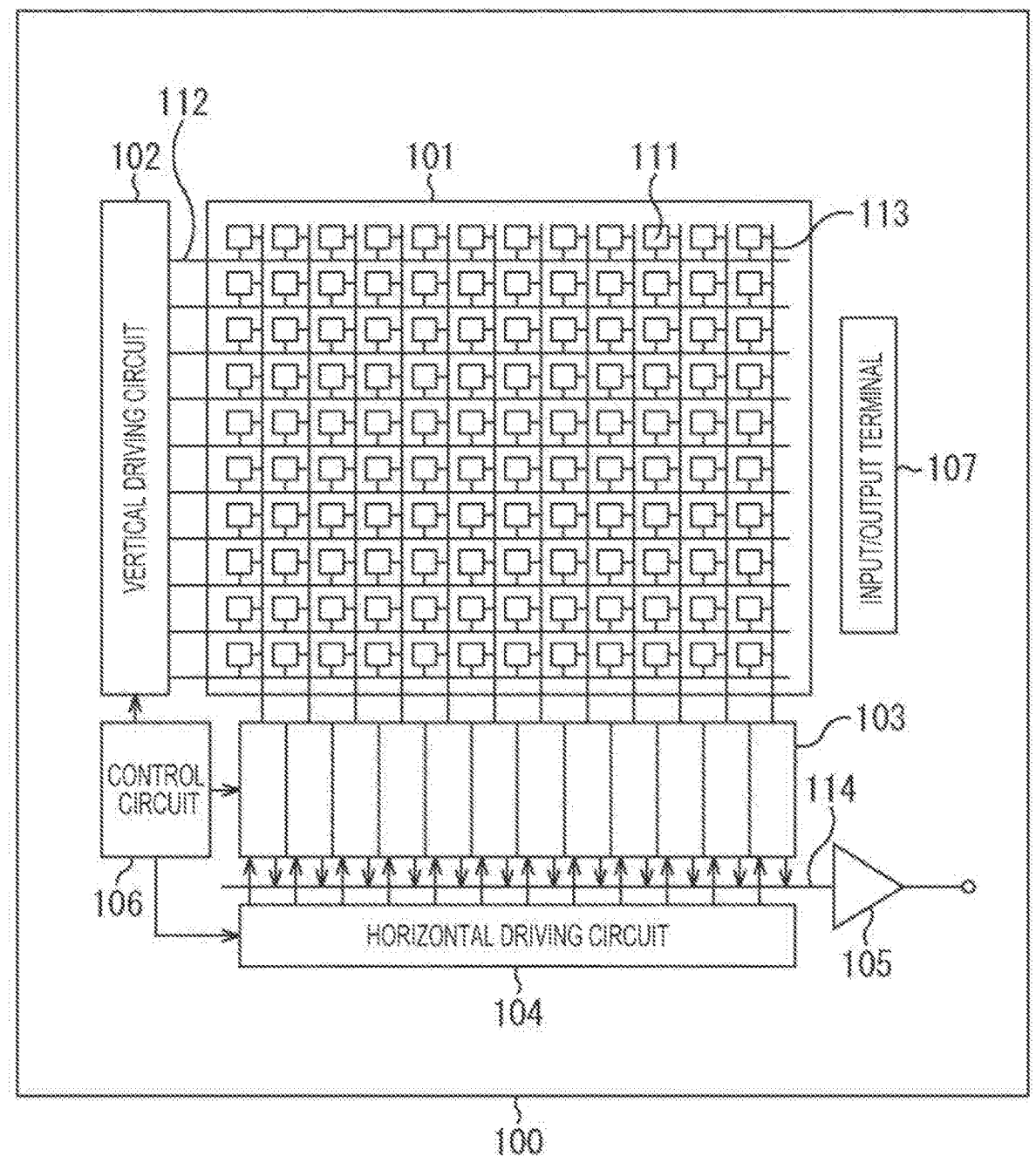
FIG. 5 is a diagram illustrating a configuration example of a solid-state imaging apparatus.

FIG. 5 is a diagram illustrating a configuration example of a solid-state imaging apparatus.

A solid-state imaging apparatus 100 of FIG. 5 is, for example, an image sensor such as a CMOS image sensor. The solid-state imaging apparatus 100 takes incident light (image light) from an object via an optical lens system (not illustrated), and converts an amount of incident light imaged on an imaging surface into an electrical signal for each pixel, and outputs the electrical signal as a pixel signal.

In FIG. 5, the solid-state imaging apparatus 100 is configured to include a pixel array unit 101, a vertical driving circuit 102, column signal processing circuits 103, a horizontal driving circuit 104, an output circuit 105, a control circuit 106, and an input/output terminal 107.

A plurality of pixels 111 is two-dimensionally arrayed in the pixel array unit 101. The pixels 111 are each configured to include a photodiode as a photoelectric conversion device and a plurality of pixel transistors.

The vertical driving circuit 102 is configured by a shift register, for example, and selects a predetermined pixel driving wiring line 112 to supply a pulse for driving the pixels 111 to the pixel driving wiring line 112 selected, and drives the pixels 111 for each row. That is, the vertical driving circuit 102 selectively scans the pixels 111 of the pixel array unit 101 in the vertical direction sequentially for each row, and supplies the pixel signal based on signal electric charges generated in accordance with a received amount of light in the photodiode of each of the pixels 111 to each of the column signal processing circuits 103 through a vertical signal line 113.

The column signal processing circuits 103 are arranged for each column of the pixels 111, and perform signal processing such as noise reduction and the like for each pixel column to a signal output from one row of the pixels 111. For example, the column signal processing circuits 103 perform signal processing such as correlated double sampling (CDS) for reducing pixel-specific fixed pattern noise and analog/digital (A/D) conversion.

The horizontal driving circuit 104 is configured by a shift register, for example, and selects each of the column signal processing circuits 103 in order by sequentially outputting horizontal scanning pulses, and causes each of the column signal processing circuits 103 to output the pixel signal to a horizontal signal line 114.

The output circuit 105 performs signal processing to a signal sequentially supplied through the horizontal signal line 114 from each of the column signal processing circuits 103 and outputs the signal. Incidentally, the output circuit 105, for example, may perform only buffering, and may perform black level adjustment, column variation correction, various types of signal processing, and the like.

The control circuit 106 controls operation of each unit of the solid-state imaging apparatus 100. For example, the control circuit 106 receives an input clock signal, and data for commanding an operation mode and the like, and furthermore, outputs data such as internal information of the solid-state imaging apparatus 100. That is, the control circuit 106 generates a clock signal as a reference of operation of the vertical driving circuit 102, the column signal processing circuits 103, the horizontal driving circuit 104, and the like, and a control signal, on the basis of a vertical synchronizing signal, a horizontal synchronizing signal, and a master clock signal. The control circuit 106 outputs the clock signal and the control signal generated, to the vertical driving circuit 102, the column signal processing circuits 103, the horizontal driving circuit 104, and the like.

The input/output terminal 107 exchanges signals with the outside.

The solid-state imaging apparatus 100 of FIG. 5 configured as described above is a CMOS image sensor referred to as a column AD system in which the column signal processing circuits 103 for performing CDS processing and A/D conversion processing are arranged for each pixel column. Furthermore, the solid-state imaging apparatus 100 of FIG. 5 can be a backside illumination type CMOS image sensor.

(Cross-Sectional Structure of Pixel)

Figure 6:
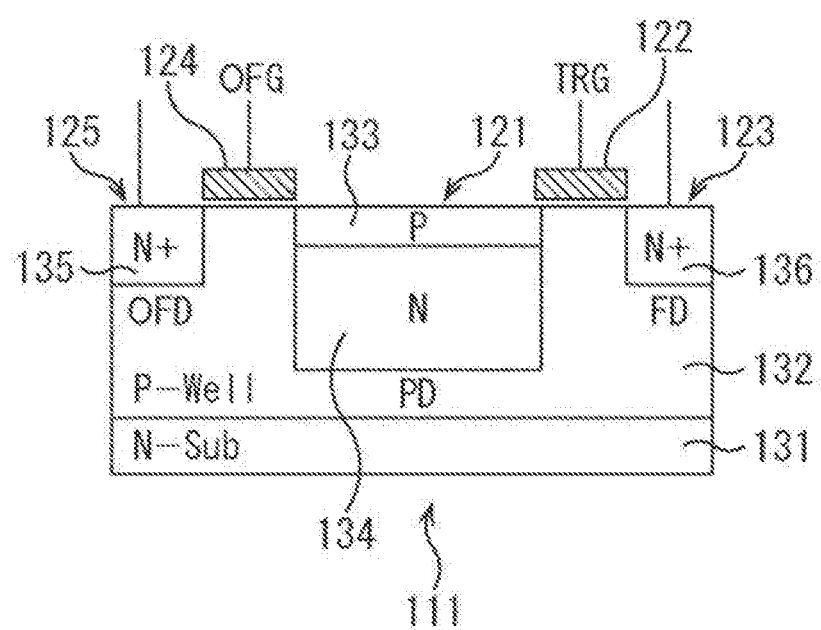
FIG. 6 is a cross-sectional view of a pixel.

FIG. 6 is a cross-sectional view of each of the pixels 111 two-dimensionally arrayed in the pixel array unit 101 of FIG. 5.

The pixels 111 each include, for example, a photodiode (PD) 121 as a photoelectric conversion device. The photodiode 121 is a photoelectric conversion unit that generates electric charges according to an amount of incident light. The photodiode 121 is, for example, a buried photodiode formed by forming a P type layer 133 on a substrate surface side and burying an N type buried layer 134, to a P type well layer 132 formed on an N type substrate 131.

The pixels 111 each include a first transfer gate (TRG) 122, a floating diffusion (FD) 123, an overflow gate (OFG) 124, and an overflow drain (OFD) 125, in addition to the photodiode 121. Incidentally, although not illustrated, the pixels 111 are each shielded by a light shielding film that shields a portion other than an aperture for introducing light to the photodiode 121 and the like.

The first transfer gate 122 is configured to include a gate electrode. As a transfer pulse TRG is applied to the gate electrode, the first transfer gate 122 transfers the electric charges generated by the photodiode 121 to the floating diffusion 123.

The floating diffusion 123 is an electric charge voltage conversion unit including an N type layer of an impurity concentration at which a contact for wiring can be electrically connected to the layer, and converts the electric charges transferred from the photodiode 121 by the first transfer gate 122 into a voltage. The upper part of the floating diffusion 123 is connected to the contact for wiring, and is connected to a plurality of pixel transistors (not illustrated).

The pixel transistors include a reset transistor, an amplifying transistor, and a selecting transistor and the like. The pixel signal indicating the voltage of the floating diffusion 123 is read and amplified by these pixel transistors, and is supplied to each of the column signal processing circuits 103 through the vertical signal line 113.

The overflow gate 124 is configured to include a gate electrode. As a discharge pulse OFG is applied to the gate electrode, the overflow gate 124 discharges unnecessary electric charges being electric charges generated by the photodiode 121 and not contributing to image formation, to the overflow drain 125.

The overflow drain 125 includes an N type layer of an impurity concentration at which a contact for wiring can be electrically connected to the layer, and receives the unnecessary electric charges being electric charges generated by the photodiode 121 and discharged from the overflow gate 124.

The pixels 111 are each configured as described above, and in the pixel array unit 101, a white (W) pixel not including a color filter is arranged, besides a red (R) pixel, a green (G) pixel, and a blue (B) pixel each including a color filter. In the following description, the R pixel, the G pixel, and the B pixel are collectively referred to as a primary color (P) pixel 111-1, and are distinguished from a W pixel 111-2 as a high sensitivity pixel. Further, an element configuring the P pixel 111-1 is described with "-1", and an element configuring the W pixel 111-2 is described with "-2" to distinguish the elements from each other.

(Potential Structure)

Figure 7:
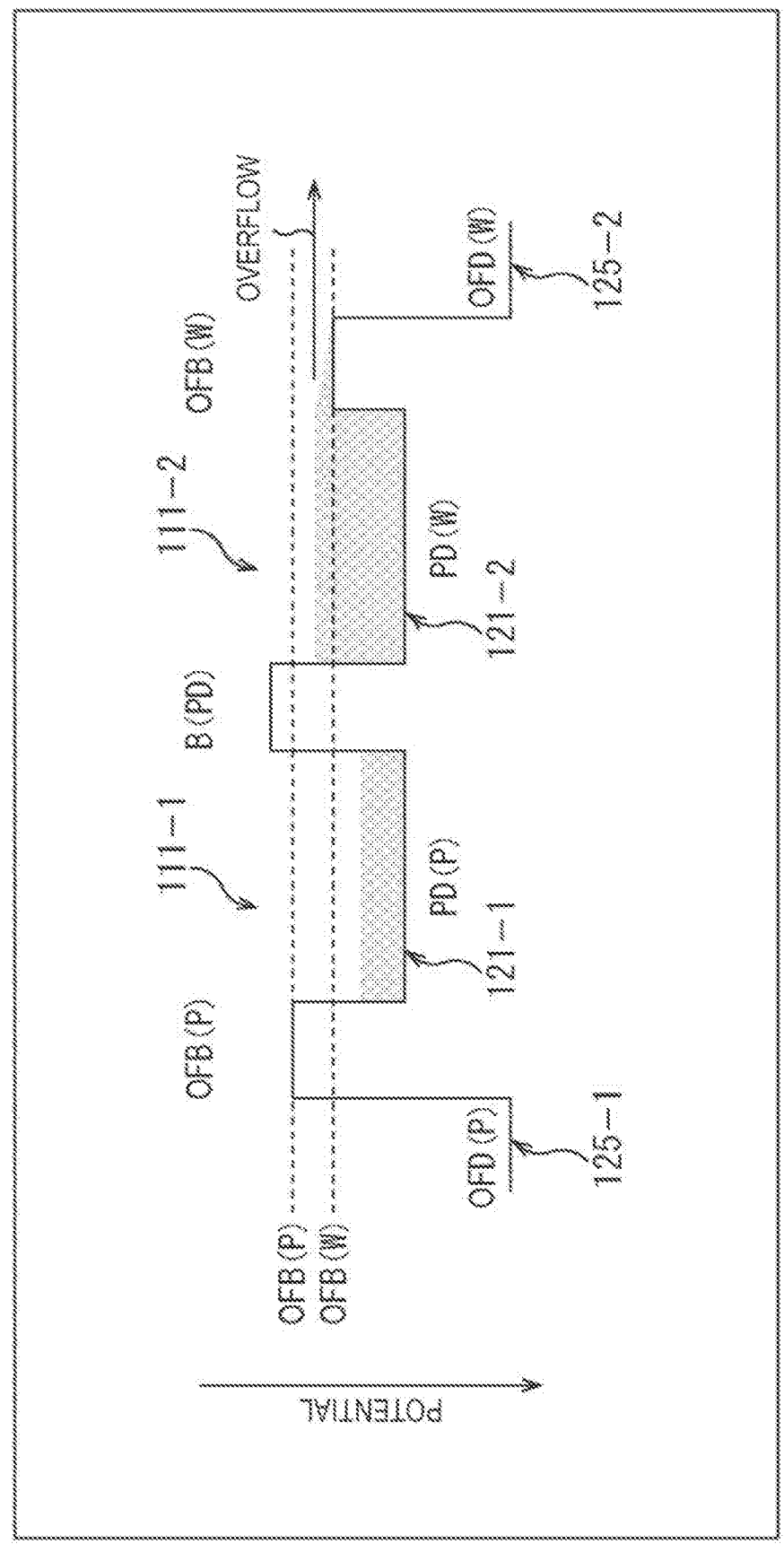
FIG. 7 is a potential diagram of pixels.

FIG. 7 is a potential diagram of the pixels 111 two-dimensionally arrayed in the pixel array unit 101 of FIG. 5. In FIG. 7, potential structures are illustrated of the W pixel 111-2, and the P pixel 111-1 adjacent to the W pixel 111-2. Incidentally, in the potential diagram, the vertical direction in the figure indicates an electric potential, and the electric potential becomes higher as it goes downward. The relationship also applies to other potential diagrams described later.

In FIG. 7, in a photodiode (PD(P)) 121-1 of the P pixel 111-1 and a photodiode (PD(W)) 121-2 of the W pixel 111-2, electric charges according to the amount of incident light are generated, and electric charges accumulated in the photodiode 121-2 is larger than electric charges accumulated in the photodiode 121-1. For that reason, the electric charges accumulated in the photodiode 121-2 reaches saturation and overflow to the photodiode 121-1 side, whereby the blooming phenomenon occurs, as mentioned above.

In the present technology, to suppress the blooming phenomenon, the heights of a potential barrier (OFB(P)) and a potential barrier (OFB(W)) are formed to be deeper than the height of a potential barrier (B(PD)), and the height of the potential barrier (OFB(W)) is formed to be deeper than the height of a potential barrier (OFB(P)). With this configuration, in the W pixel 111-2, the electric charges accumulated in the photodiode 121-2 are discharged to an overflow drain (OFD(W)) 125-2 side before saturation, so that the blooming phenomenon can be suppressed.

However, the potential barrier (OFB(P)) is an electrical barrier formed between the photodiode (PD(P)) 121-1 and an overflow drain (OFD(P)) 125-1 in the P pixel 111-1. Furthermore, the potential barrier (OFB(W)) is an electrical barrier formed between the photodiode (PD(W)) 121-2 and the overflow drain (OFD(W)) 125-2 in the W pixel 111-2. Furthermore, the potential barrier (B(PD)) is an electrical barrier formed between the photodiode (PD(P)) 121-1 and the photodiode (PD(W)) 121-2. Further, forming the height of the potential barrier to be deeper means making the potential barrier to be in a + side in a case illustrated in the potential structure of FIG. 7.

The blooming phenomenon is suppressed by the principle described above, and a specific method for controlling a potential barrier (OFB) is described below with reference to a first embodiment to a fourth embodiment.

3. First Embodiment (Planar Structure of Pixel)

Figure 8:
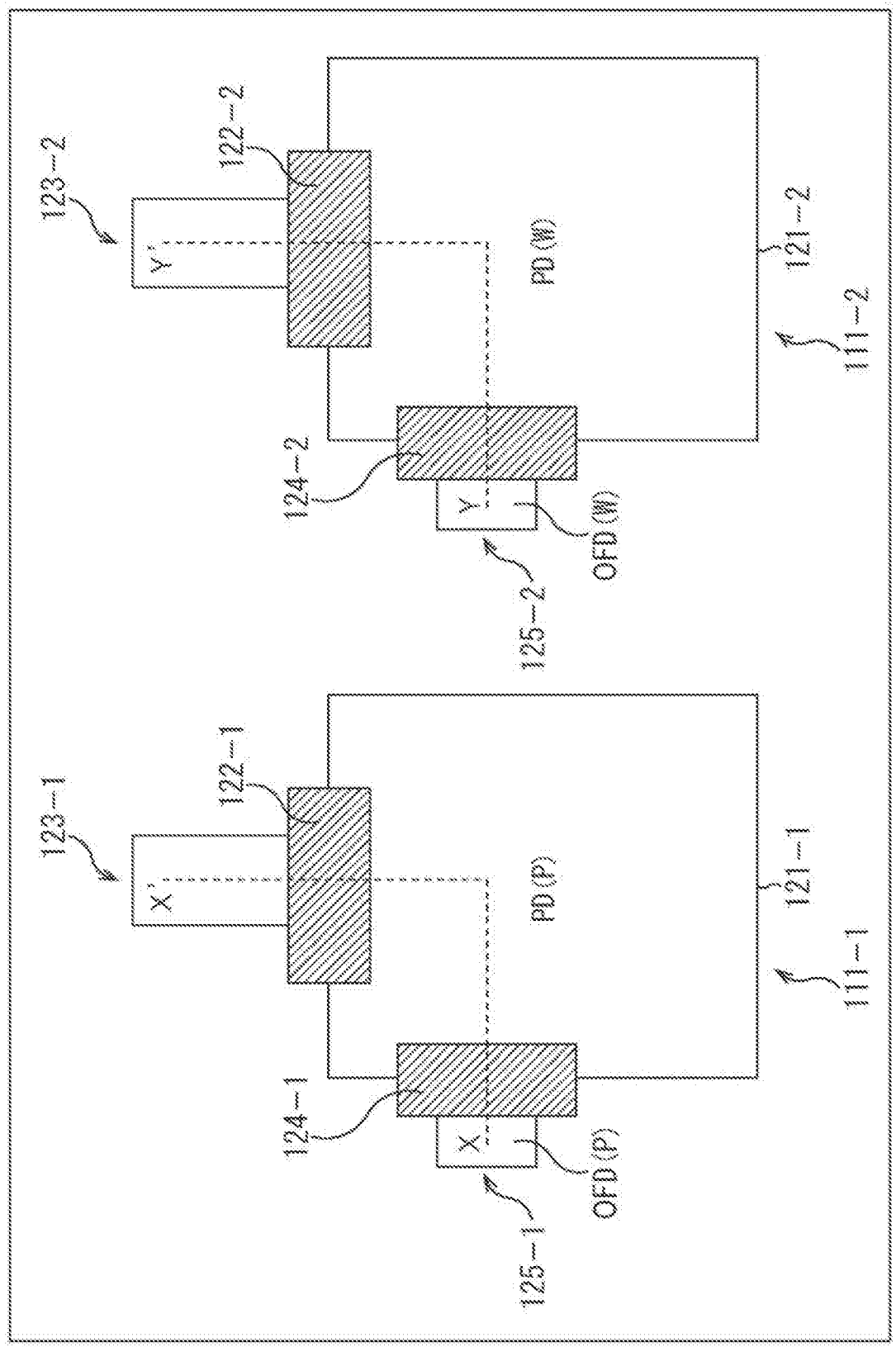
FIG. 8 is a plan view of pixels in a first embodiment.

FIG. 8 is a plan view of pixels 111 in the first embodiment.

In FIG. 8, in a P pixel 111-1 being an adjacent pixel to a W pixel 111-2, electric charges accumulated in a photodiode 121-1 are transferred to a floating diffusion 123-1, by a first transfer gate 122-1. Furthermore, unnecessary electric charges being electric charges generated by the photodiode 121-1 are discharged to an overflow drain 125-1, by an overflow gate 124-1.

Meanwhile, in the W pixel 111-2 being a high sensitivity pixel, electric charges accumulated in a photodiode 121-2 are transferred to a floating diffusion 123-2 by a first transfer gate 122-2. Furthermore, unnecessary electric charges being electric charges generated by the photodiode 121-2 are discharged to an overflow drain 125-2, by an overflow gate 124-2.

(Cross-Sectional Structure and Potential Structure of Pixel)

Figure 9:
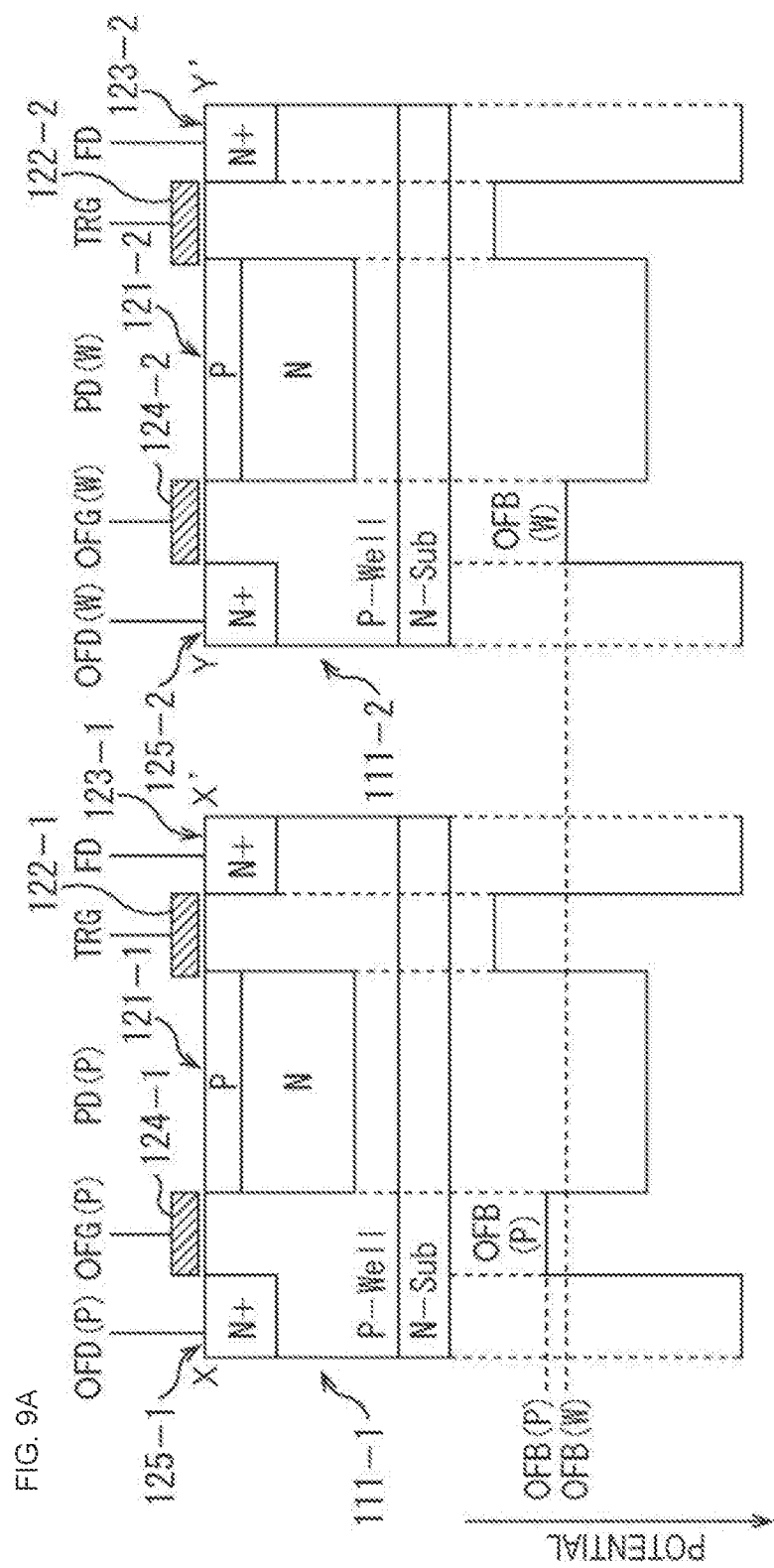
FIGS. 9A and 9B are potential diagrams of the pixels in the first embodiment.

FIGS. 9A and 9B illustrate cross-sectional structures and potential diagrams of the pixels 111 in the first embodiment.

FIG. 9A, the P pixel 111-1 corresponds to a cross section of X-X' in the P pixel 111-1 of FIG. 8, and the W pixel 111-2 corresponds to a cross section of Y-Y' in the W pixel 111-2 of FIG. 8. Furthermore, the potential diagrams of FIG. 9B correspond to the cross-sectional structures of the pixels 111 of FIG. 9A.

In the P pixel 111-1, the overflow gate 124-1 capable of blocking and switching a flow of the unnecessary electric charges being electric charges generated by the photodiode 121-1 and not contributing to image formation in accordance with the height of a potential barrier (OFB(P)), and the overflow drain 125-1 that receives the unnecessary electric charges swept out via the overflow gate 124-1 from the photodiode 121-1 are formed. However, the overflow drain 125-1 is formed at a side opposite to the photodiode 121-1 with respect to the overflow gate 124-1.

Meanwhile, in the W pixel 111-2, the overflow gate 124-2 capable of blocking and switching a flow of the unnecessary electric charges being electric charges generated by the photodiode 121-2 and not contributing to image formation in accordance with the height of a potential barrier (OFB(W)), and the overflow drain 125-2 that receives the unnecessary electric charges swept out via the overflow gate 124-2 from the photodiode 121-2 are formed. However, the overflow drain 125-2 is formed at a side opposite to the photodiode 121-2 with respect to the overflow gate 124-2.

Herein, when the electric charges are accumulated in the photodiode 121-1 and the photodiode 121-2, by controlling discharge pulses OFG applied to gate electrodes of the overflow gate 124-1 and the overflow gate 124-2, the height of the potential barrier (OFB(W)) is formed to be deeper than the height of the potential barrier (OFB(P)).

Specifically, for example, as a discharge pulse OFG(P) applied to the gate electrode of the overflow gate 124-1, a voltage of 0 V is applied, and as a discharge pulse OFG(W) applied to the gate electrode of the overflow gate 124-2, a voltage of 0.1 V is applied. That is, as the discharge pulses OFG, voltages that satisfy a relationship of the following expression (1) are applied.

$$OFG(P) < OFG(W) \qquad (1)$$

With this configuration, the height of the potential barrier (OFB(W)) is formed to be deeper than the height of the potential barrier (OFB(P)), so that the electric charges accumulated in the photodiode 121-2 are prevented from reaching saturation and overflowing to the photodiode 121-1 side, and the blooming phenomenon can be suppressed.

Incidentally, the discharge pulses OFG are supplied from the vertical driving circuit 102 (FIG. 5), so that, for example, the vertical driving circuit 102 controls the voltages applied to the overflow gate 124-1 of the P pixel 111-1 and the overflow gate 124-2 of the W pixel 111-2. However, instead of the vertical driving circuit 102, for example, the voltage applied to each overflow gate 124 may be controlled in accordance with a signal and the like input via the input/output terminal 107 (FIG. 5) or the control circuit 106 (FIG. 5).

As described above, in the first embodiment, by controlling the voltages applied to the overflow gate 124-1 of the P pixel 111-1 and the voltage applied to the overflow gate 124-2 of the W pixel 111-2, the height of the potential barrier (OFB(W)) is formed to be deeper than the height of the potential barrier (OFB(P)).

With this configuration, the electric charges accumulated in the photodiode 121-2 of the W pixel 111-2 are prevented from reaching saturation and overflowing to the photodiode 121-1 side of the P pixel 111-1, and the blooming phenomenon can be suppressed. For that reason, coloration occurring due to the blooming phenomenon can be improved, and degradation of image quality can be suppressed.

4. Second Embodiment (Planar Structure of Pixel)

Figure 10:
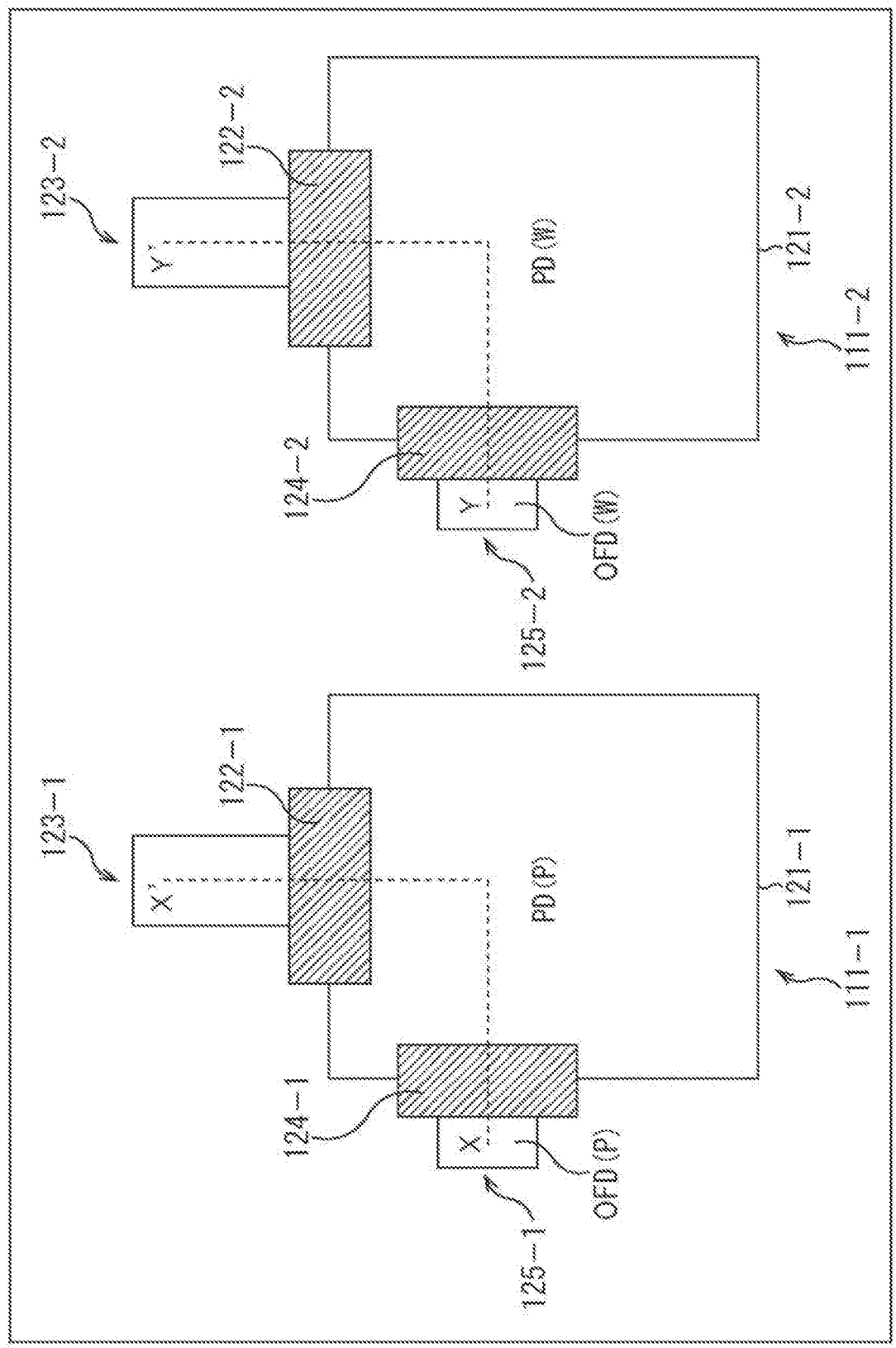
FIG. 10 is a plan view of pixels in a second embodiment.

FIG. 10 is a plan view of pixels 111 in the second embodiment.

In FIG. 10, in a P pixel 111-1, electric charges accumulated in a photodiode 121-1 are transferred to a floating diffusion 123-1, by a first transfer gate 122-1. Furthermore, unnecessary electric charges being electric charges generated by the photodiode 121-1 are discharged to an overflow drain 125-1, by an overflow gate 124-1.

Meanwhile, in a W pixel 111-2, electric charges accumulated in a photodiode 121-2 are transferred to a floating diffusion 123-2 by a first transfer gate 122-2. Furthermore, unnecessary electric charges being electric charges generated by the photodiode 121-2 are discharged to an overflow drain 125-2, by an overflow gate 124-2.

(Cross-Sectional Structure and Potential Structure of Pixel)

Figure 11:
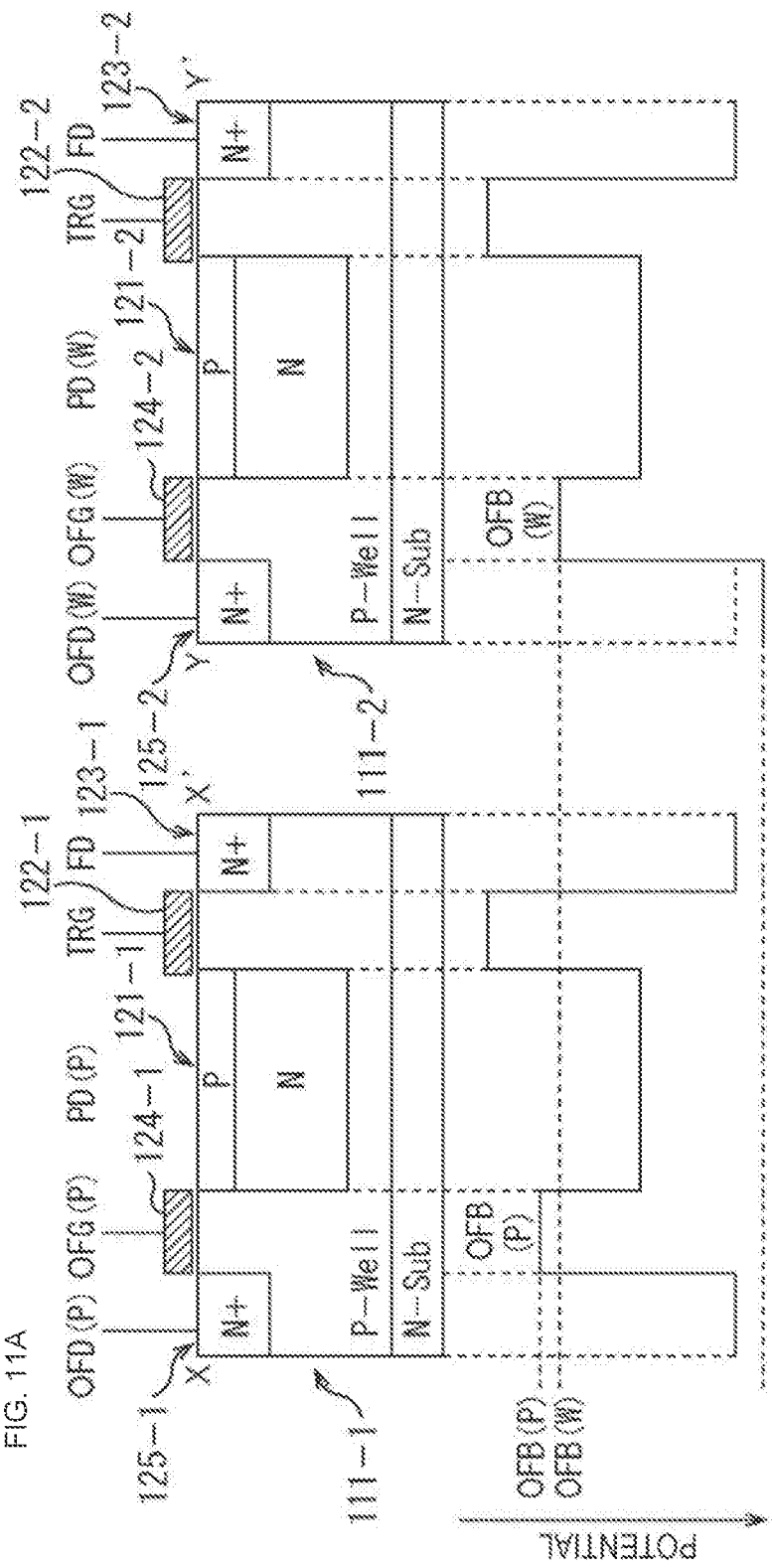
FIGS. 11A and 11B are potential diagrams of the pixels in the second embodiment.

FIGS. 11A and 11B illustrate cross-sectional structures and potential diagrams of the pixels 111 in the second embodiment.

FIG. 11A, the P pixel 111-1 corresponds to a cross section of X-X' in the P pixel 111-1 of FIG. 10, and the W pixel 111-2 corresponds to a cross section of Y-Y' in the W pixel 111-2 of FIG. 10. Furthermore, the potential diagrams of FIG. 11B correspond to the cross-sectional structures of the pixels 111 of FIG. 11A.

In the P pixel 111-1, the overflow gate 124-1 capable of blocking and switching a flow of the unnecessary electric charges being electric charges generated by the photodiode 121-1 and not contributing to image formation in accordance with the height of a potential barrier (OFB(P)), and the overflow drain 125-1 that receives the unnecessary electric charges swept out via the overflow gate 124-1 from the photodiode 121-1 are formed.

Meanwhile, in the W pixel 111-2, the overflow gate 124-2 capable of blocking and switching a flow of the unnecessary electric charges being electric charges generated by the photodiode 121-2 and not contributing to image formation in accordance with the height of a potential barrier (OFB(W)), and the overflow drain 125-2 that receives the unnecessary electric charges swept out via the overflow gate 124-2 from the photodiode 121-2 are formed.

Herein, when the electric charges are accumulated in the photodiode 121-1 and the photodiode 121-2, by controlling control pulses OFD applied to contacts of the overflow drain 125-1 and the overflow drain 125-2, the height of the potential barrier (OFB(W)) is formed to be deeper than the height of the potential barrier (OFB(P)).

Specifically, for example, as a control pulse OFD(P) applied to the contact of the overflow drain 125-1, a voltage of 5.0 V is applied, and as a control pulse OFD(W) applied to the contact of the overflow drain 125-2, a voltage of 5.5 V is applied. That is, as the control pulses OFD, voltages that satisfy a relationship of the following expression (2) are applied.

$$OFD(P) < OFD(W) \qquad (2)$$

With this configuration, in conjunction with potentials of the overflow drains 125-1 and 125-2, the height of the potential barrier (OFB(W)) is formed to be deeper than the height of the potential barrier (OFB(P)), so that the electric charges accumulated in the photodiode 121-2 are prevented from reaching saturation and overflowing to the photodiode 121-1 side, and the blooming phenomenon can be suppressed.

Incidentally, as the control pulses OFD, the voltages applied to the overflow drain 125-1 of the P pixel 111-1 and the overflow drain 125-2 of the W pixel 111-2 are controlled by, for example, the vertical driving circuit 102 (FIG. 5). However, instead of the vertical driving circuit 102, for example, the voltage applied to each overflow drain 125 may be controlled in accordance with a signal and the like input via the input/output terminal 107 (FIG. 5) or the control circuit 106 (FIG. 5).

As described above, in the second embodiment, by controlling the voltages applied to the overflow drain 125-1 of the P pixel 111-1 and the voltage applied to the overflow drain 125-2 of the W pixel 111-2, the height of the potential barrier (OFB(W)) is formed to be deeper than the height of the potential barrier (OFB(P)).

With this configuration, the electric charges accumulated in the photodiode 121-2 of the W pixel 111-2 are prevented from reaching saturation and overflowing to the photodiode 121-1 side of the P pixel 111-1, and the blooming phenomenon can be suppressed. For that reason, coloration occurring due to the blooming phenomenon can be improved, and degradation of image quality can be suppressed.

5. Third Embodiment (Planar Structure of Pixel)

Figure 12:
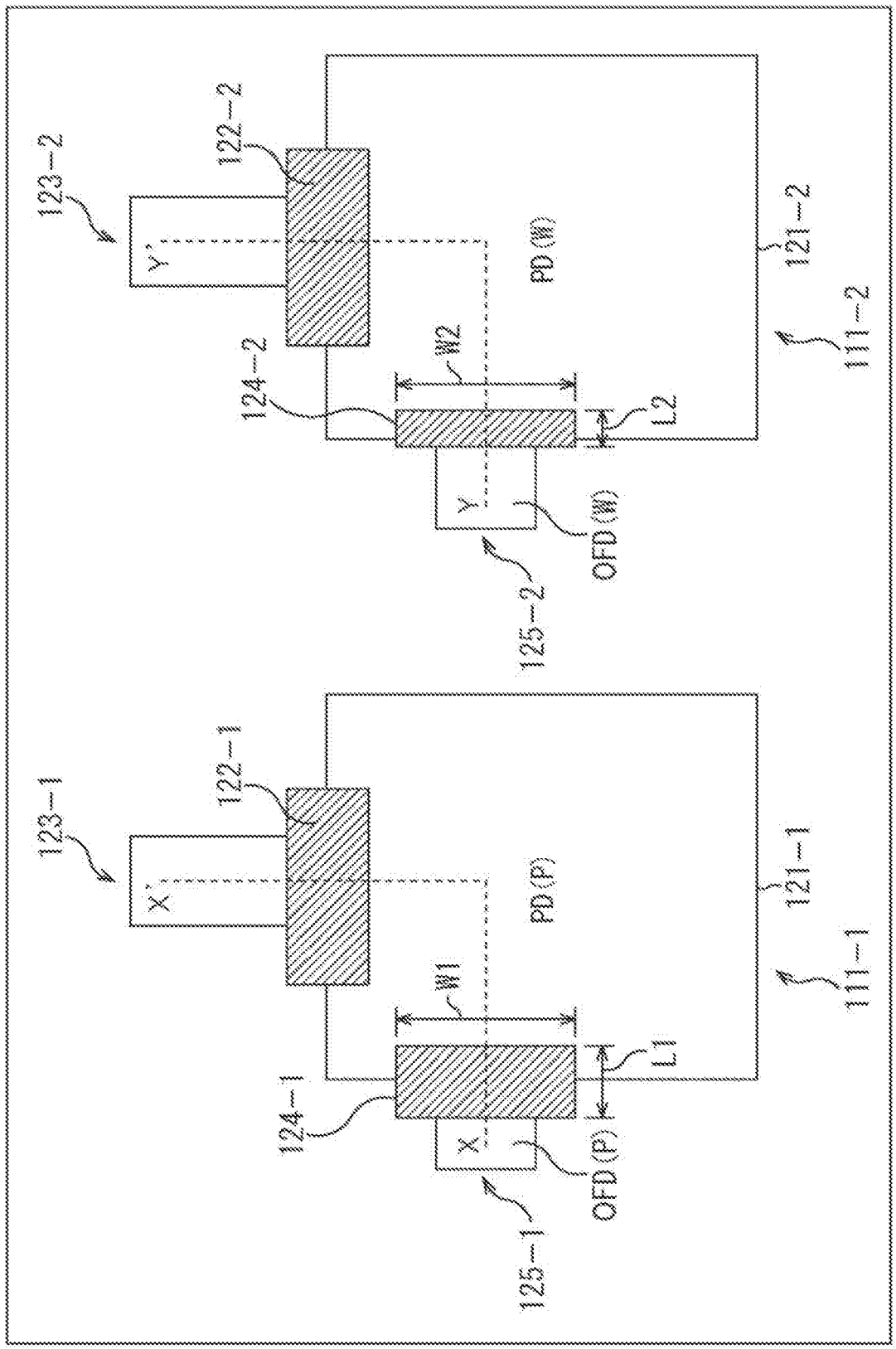
FIG. 12 is a plan view of pixels in a third embodiment.

FIG. 12 is a plan view of pixels 111 in the third embodiment.

In FIG. 12, in a P pixel 111-1, electric charges accumulated in a photodiode 121-1 are transferred to a floating diffusion 123-1, by a first transfer gate 122-1. Furthermore, unnecessary electric charges being electric charges generated by the photodiode 121-1 are discharged to an overflow drain 125-1, by an overflow gate 124-1.

Meanwhile, in a W pixel 111-2, electric charges accumulated in a photodiode 121-2 are transferred to a floating diffusion 123-2 by a first transfer gate 122-2. Furthermore, unnecessary electric charges being electric charges generated by the photodiode 121-2 are discharged to an overflow drain 125-2, by an overflow gate 124-2.

Herein, by making a gate size of the overflow gate 124-1 and a gate size of the overflow gate 124-2 different from each other, the height of a potential barrier (OFB(W)) is formed to be deeper than the height of a potential barrier (OFB(P)).

Specifically, for example, a gate length (L1) (of a gate electrode) of the overflow gate 124-1 is made to be longer than a gate length (L2) (of a gate electrode) of the overflow gate 124-2. That is, the gate length (L2) of the overflow gate 124-2 becomes shorter than the gate length (L1) of the overflow gate 124-1. With this configuration, as a discharge pulse OFG(P) applied to the gate electrode of the overflow gate 124-1 and a discharge pulse OFG(W) applied to the gate electrode of the overflow gate 124-2, even in a case where the same voltages are applied, the height of the potential barrier (OFB(W)) is formed to be deeper than the height of the potential barrier (OFB(P)).

Incidentally, herein, a case has been described where the gate length (L1) of the overflow gate 124-1 and the gate length (L2) of the overflow gate 124-2 are adjusted; however, at least one of the gate length (L1, L2) and the gate width (W1, W2) only needs to be adjusted so that the height of the potential barrier (OFB(W)) is formed to be deeper than the height of the potential barrier (OFB(P)), for example, by adjusting a gate width (W2) of the overflow gate 124-2 to become longer than a gate width (W1) of the overflow gate 124-1.

(Cross-Sectional Structure and Potential Structure of Pixel)

Figures 13A, 13B:
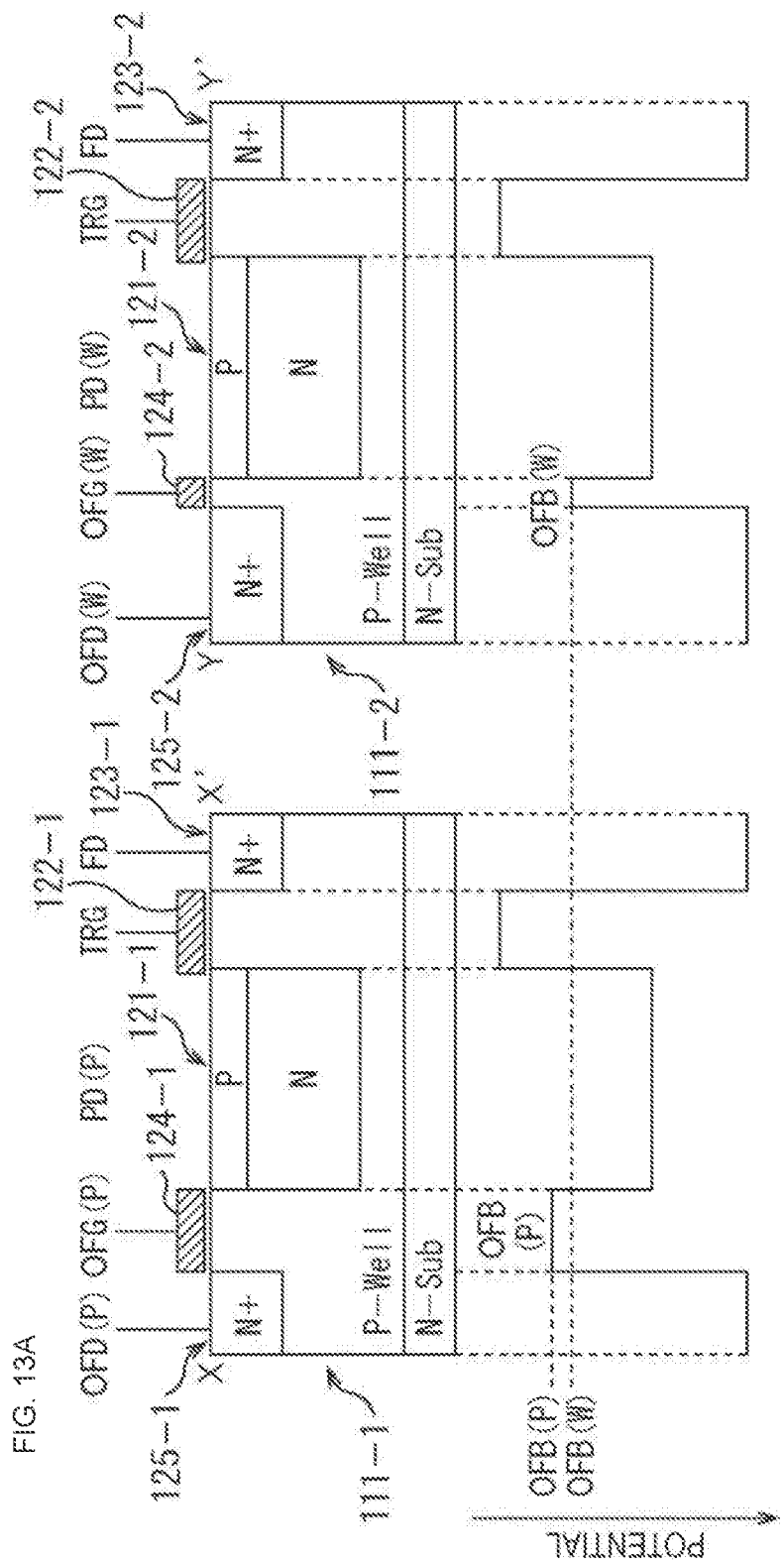
FIGS. 13A and 13B are potential diagrams of the pixels in the third embodiment.

FIGS. 13A and 13B illustrate cross-sectional structures and potential diagrams of the pixels 111 in the third embodiment.

In FIG. 13A, the P pixel 111-1 corresponds to a cross section of X-X' in the P pixel 111-1 of FIG. 12, and the W pixel 111-2 corresponds to a cross section of Y-Y' in the W pixel 111-2 of FIG. 12. Furthermore, the potential diagrams of FIG. 13B correspond to cross-sectional structures of the pixels 111 of FIG. 13A.

In the P pixel 111-1, the overflow gate 124-1 capable of blocking and switching a flow of the unnecessary electric charges being electric charges generated by the photodiode 121-1 and not contributing to image formation in accordance with the height of a potential barrier (OFB(P)), and the overflow drain 125-1 that receives the unnecessary electric charges swept out via the overflow gate 124-1 from the photodiode 121-1 are formed.

Meanwhile, in the W pixel 111-2, the overflow gate 124-2 capable of blocking and switching a flow of the unnecessary electric charges being electric charges generated by the photodiode 121-2 and not contributing to image formation in accordance with the height of a potential barrier (OFB(W)), and the overflow drain 125-2 that receives the unnecessary electric charges swept out via the overflow gate 124-2 from the photodiode 121-2 are formed.

Herein, since the gate length (L1) of the overflow gate 124-1 and the gate length (L2) of the overflow gate 124-2 are adjusted (L1>L2), when the electric charges are accumulated in the photodiode 121-1 and the photodiode 121-2, even in a case where the same voltages (for example, 0.1 V) are applied as discharge pulses OFG applied to gate electrodes of the overflow gate 124-1 and the overflow gate 124-2, the height of the potential barrier (OFB(W)) is formed to be deeper than the height of the potential barrier (OFB(P)).

In this way, by making gate sizes (of the gate electrodes) of the overflow gate 124-1 and the overflow gate 124-2 different from each other, as the discharge pulses OFG, even in a case where the same voltages are applied, the height of the potential barrier (OFB(W)) is formed to be deeper than the height of the potential barrier (OFB(P)), so that the electric charges accumulated in the photodiode 121-2 are prevented from reaching saturation and overflowing to the photodiode 121-1 side, and the blooming phenomenon can be suppressed.

Incidentally, by adjusting an impurity concentration near the overflow gate 124-1 in the P pixel 111-1 and an impurity concentration near the overflow gate 124-2 in the W pixel 111-2, as the discharge pulses OFG, in a case where the same voltages are applied, the height of the potential barrier (OFB(W)) may be formed to be deeper than the height of the potential barrier (OFB(P)).

Specifically, for example, by making the impurity concentration in the lower part of the overflow gate 124-2 lower than the impurity concentration in the lower part of the overflow gate 124-1, the height of the potential barrier (OFB(W)) can be formed to be deeper than the height of the potential barrier (OFB(P)). Furthermore, by combining adjustment of the gate size of the overflow gate 124 and adjustment of the impurity concentration in the lower part, the height of the potential barrier (OFB(W)) may be formed to be deeper than the height of the potential barrier (OFB(P)).

As described above, in the third embodiment, by making the gate sizes of the overflow gate 124-1 and the overflow gate 124-2 different from each other, or making the impurity concentrations in the lower parts different from each other, the height of the potential barrier (OFB(W)) is formed to be deeper than the height of the potential barrier (OFB(P)).

With this configuration, the electric charges accumulated in the photodiode 121-2 of the W pixel 111-2 are prevented from reaching saturation and overflowing to the photodiode 121-1 side of the P pixel 111-1, and the blooming phenomenon can be suppressed. For that reason, coloration occurring due to the blooming phenomenon can be improved, and degradation of image quality can be suppressed.

6. Fourth Embodiment

By the way, in a solid-state imaging apparatus 100 such as a CMOS image sensor, generally, signal read operation for reading electric charges accumulated in a photodiode is performed for each row of a pixel array unit 101, and a pixel from which the signal read operation has ended starts accumulation of the electric charges again from the end point in time. By performing the signal read operation for each row of the pixel array unit 101 in this way, in the solid-state imaging apparatus 100, electric charge accumulation periods cannot be matched with each other in all pixels, and distortion occurs in a captured image in a case where an object moves, and the like. For example, in a case where an object straight in the vertical direction moving in the horizontal direction is imaged, the object is imaged as if it is tilted.

To avoid occurrence of the distortion in the image of the object, an all-pixel simultaneous electronic shutter of the solid-state imaging apparatus 100 in which exposure periods of the pixels are the same as each other has been developed.

The all-pixel simultaneous electronic shutter performs operation in which exposure is simultaneously started and the exposure is simultaneously ended for all pixels effective for imaging, and is also referred to as a global shutter (global exposure).

To realize a global shutter function, electric charge discharge operation for emptying the accumulated electric charges from the photodiode is simultaneously performed for all pixels to start the exposure, and at the exposure period end point in time, photoelectric charges accumulated by simultaneous driving of transfer gates of all pixels are all transferred to a memory unit and held. Then, a floating diffusion (FD) is reset, and then the held electric charges in the memory unit are transferred to the floating diffusion, and reading of a signal level is performed. Hereinafter, a case is described where the present technology is applied to the solid-state imaging apparatus 100 having the global shutter function.

(Cross-Sectional Structure of Pixel)

Figure 14:
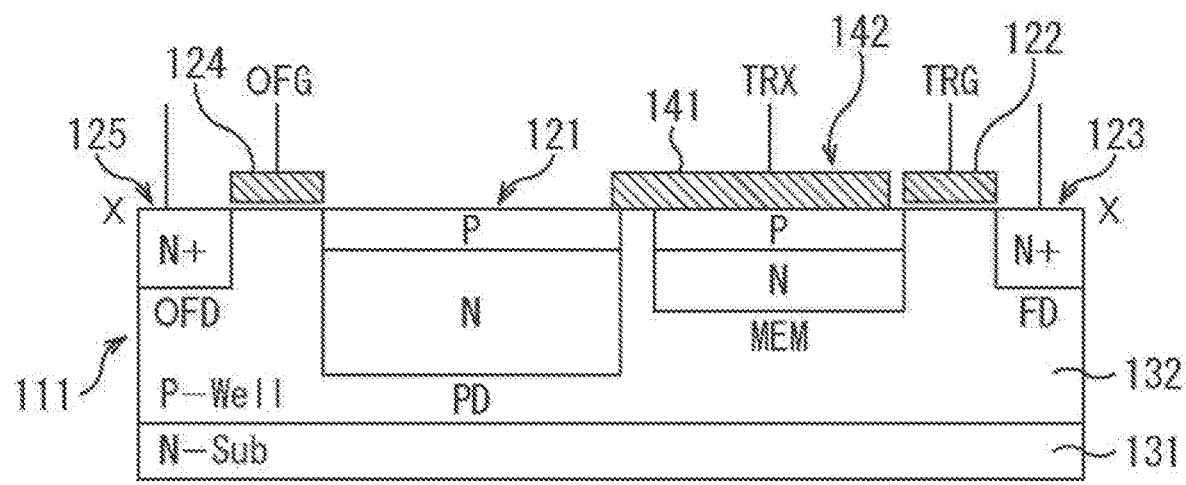
FIG. 14 is a cross-sectional view of a pixel in a fourth embodiment.

FIG. 14 is a cross-sectional view of each of pixels 111 in the fourth embodiment. That is, FIG. 14 illustrates a cross-sectional structure of each of the pixels 111 two-dimensionally arrayed in the pixel array unit 101 in the solid-state imaging apparatus 100 having the global shutter function. Incidentally, in the cross-sectional structure of each of the pixels 111 in FIG. 14, portions corresponding to the cross-sectional structure of each of the pixels 111 of FIG. 6 are denoted by the same reference numerals, and the description thereof is omitted as appropriate.

The pixels 111 each include a second transfer gate (TRX) 141 and a memory unit (MEM) 142, in addition to a photodiode 121, a first transfer gate (TRG) 122, a floating diffusion (FD) 123, an overflow gate (OFG) 124, and an overflow drain (OFD) 125.

The second transfer gate 141 is configured to include a gate electrode. The second transfer gate 141 is formed to cover a portion between the photodiode 121 and the memory unit 142, and a part of the upper part of the memory unit 142. As a transfer pulse TRX is applied to the gate electrode, the second transfer gate 141 transfers the electric charges generated by the photodiode 121, to the memory unit 142. The memory unit 142 is formed by, for example, forming a P type layer on a substrate surface side and burying an N type buried layer, to a P type well layer 132 formed on an N type substrate. The memory unit 142 holds the electric charges transferred from the photodiode 121 by the second transfer gate 141.

As a transfer pulse TRG is applied to the gate electrode, the first transfer gate (TRG) 122 transfers the electric charges held by the memory unit 142, to the floating diffusion 123.

In FIG. 14, the overflow gate 124 and the overflow drain 125 are configured similarly to the cross-sectional structure of each of the pixels 111 of FIG. 6.

The pixels 111 each having the global shutter function are configured as described above, and in the pixel array unit 101, a white (W) pixel not including a color filter is arranged, besides a red (R) pixel, a green (G) pixel, and a blue (B) pixel each including a color filter. Also in the following description, similarly, the R pixel, the G pixel, and the B pixel are collectively referred to as a P pixel 111-1, and are distinguished from a W pixel 111-2 as a high sensitivity pixel.

(Planar Structure of Pixel)

Figure 15:
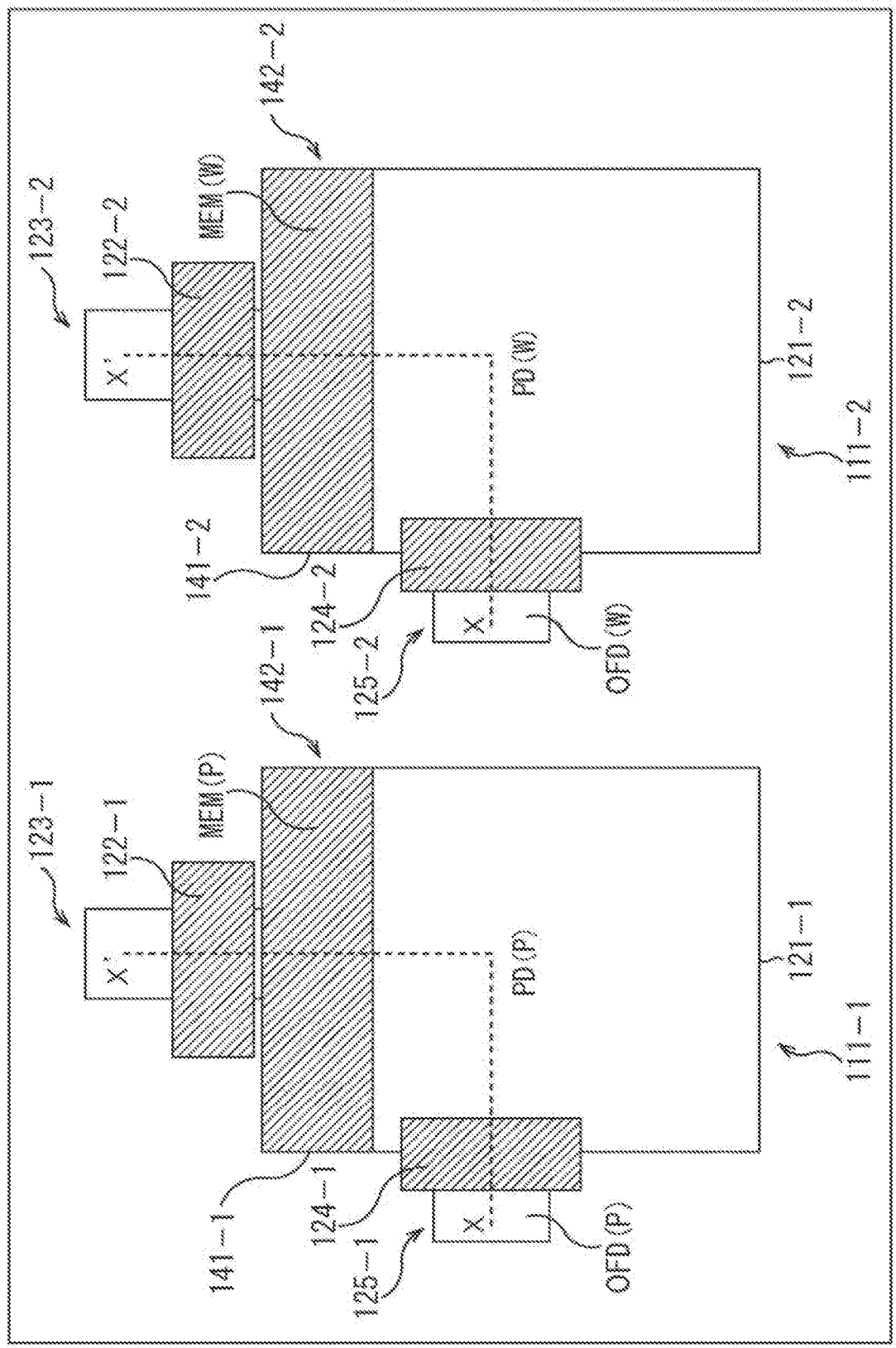
FIG. 15 is a plan view of pixels in the fourth embodiment.

FIG. 15 is a plan view of the pixels 111 in the fourth embodiment. In FIG. 15, the P pixel 111-1 and the W pixel 111-2 each correspond to the cross section of X-X' in each of the pixels 111 of FIG. 14.

In FIG. 15, in the P pixel 111-1, electric charges accumulated in a photodiode 121-1 are transferred to a memory unit 142-1 by a second transfer gate 141-1. Then, the electric charges held by the memory unit 142-1 are transferred to a floating diffusion 123-1, by a first transfer gate 122-1. Furthermore, unnecessary electric charges being electric charges generated by the photodiode 121-1 are discharged to an overflow drain 125-1, by an overflow gate 124-1.

Meanwhile, in the W pixel 111-2, electric charges accumulated in a photodiode 121-2 are transferred to a memory unit 142-2, by a second transfer gate 141-2. Then, the electric charges held by the memory unit 142-2 are transferred to a floating diffusion 123-2, by a first transfer gate 122-2. Furthermore, unnecessary electric charges being electric charges generated by the photodiode 121-2 are discharged to an overflow drain 125-2, by an overflow gate 124-2.

(Potential Structure)

Figure 16:
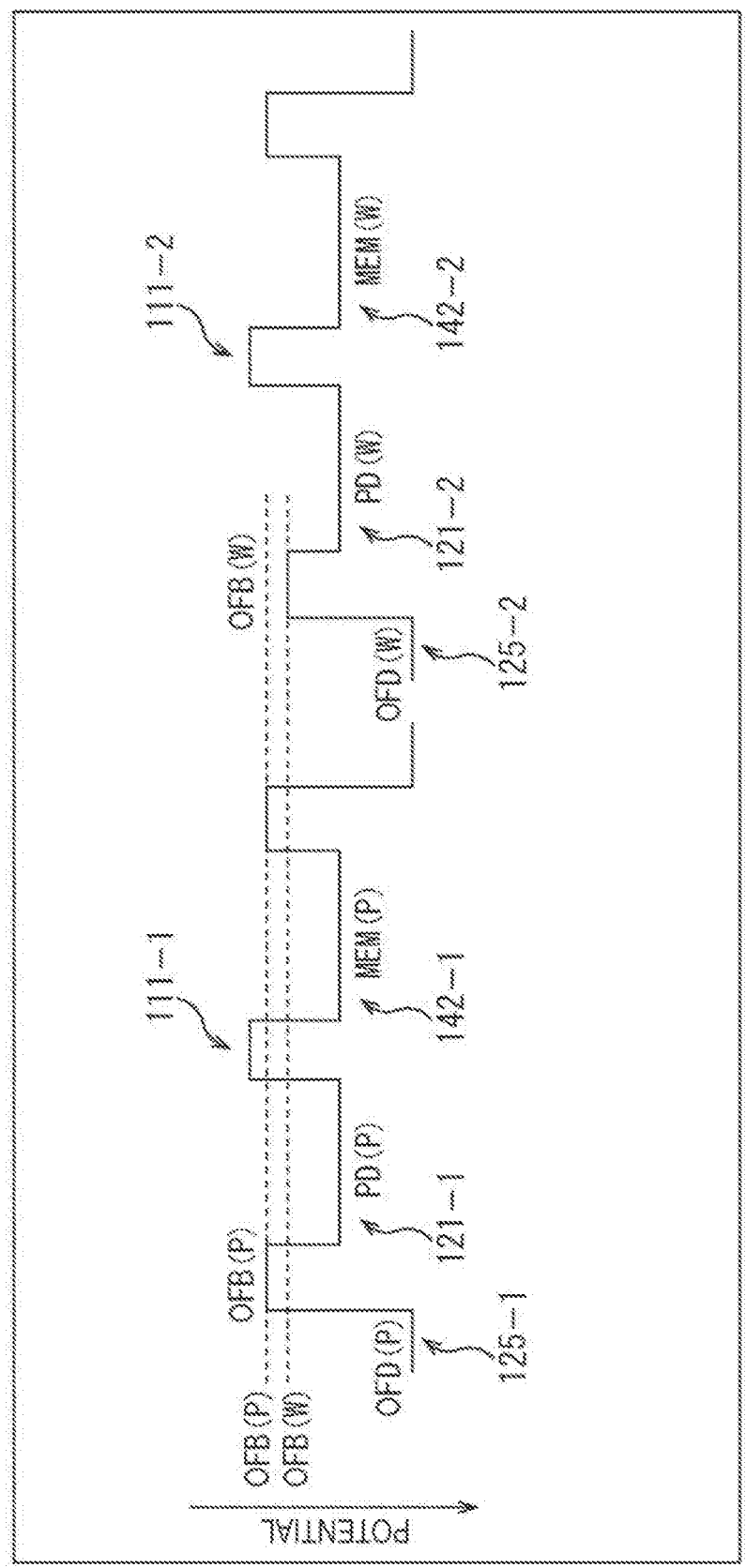
FIG. 16 is a potential diagram of the pixels in the fourth embodiment.

FIG. 16 illustrates potential diagrams of the pixels 111 in the fourth embodiment. Incidentally, the potential diagrams of FIG. 16 each correspond to the cross-sectional structure of each of the pixels 111 of FIG. 14.

That is, in the P pixel 111-1, the overflow gate 124-1 capable of blocking and switching a flow of the unnecessary electric charges being electric charges generated by the photodiode 121-1 and not contributing to image formation in accordance with the height of a potential barrier (OFB(P)), and the overflow drain 125-1 that receives the unnecessary electric charges swept out via the overflow gate 124-1 from the photodiode 121-1 are formed. Furthermore, the memory unit 142-1 is formed at a side opposite to the overflow drain 125-1 with respect to the photodiode 121-1.

Meanwhile, in the W pixel 111-2, the overflow gate 124-2 capable of blocking and switching a flow of the unnecessary electric charges being electric charges generated by the photodiode 121-2 and not contributing to image formation in accordance with the height of a potential barrier (OFB(W)), and the overflow drain 125-2 that receives the unnecessary electric charges swept out via the overflow gate 124-2 from the photodiode 121-2 are formed. Furthermore, the memory unit 142-2 is formed at a side opposite to the overflow drain 125-2 with respect to the photodiode 121-2.

Also in the pixels 111 each having the global shutter function, similarly to the above-described first embodiment to the third embodiment, for example, by controlling a voltage applied to the overflow gate 124, controlling a voltage applied to the overflow drain 125, or adjusting a gate size of the overflow gate 124 and an impurity concentration near the overflow gate 124, the height of the potential barrier (OFB(W)) is formed to be deeper than the height of the potential barrier (OFB(P)).

With this configuration, for example, the electric charges accumulated in the photodiode 121-2 of the W pixel 111-2 are prevented from reaching saturation and overflowing to the memory unit 142-1 side of the P pixel 111-1 and the like, and the blooming phenomenon can be suppressed. For that reason, coloration occurring due to the blooming phenomenon can be improved, and degradation of image quality can be suppressed.

(Improvement of Linearity)

By using the method for controlling the potential barrier (OFB) described in the first embodiment to the fourth embodiment to form the height of the potential barrier (OFB(W)) to be deeper than the height of the potential barrier (OFB(P)), the blooming phenomenon is suppressed and linearity is improved.

Figure 17B:
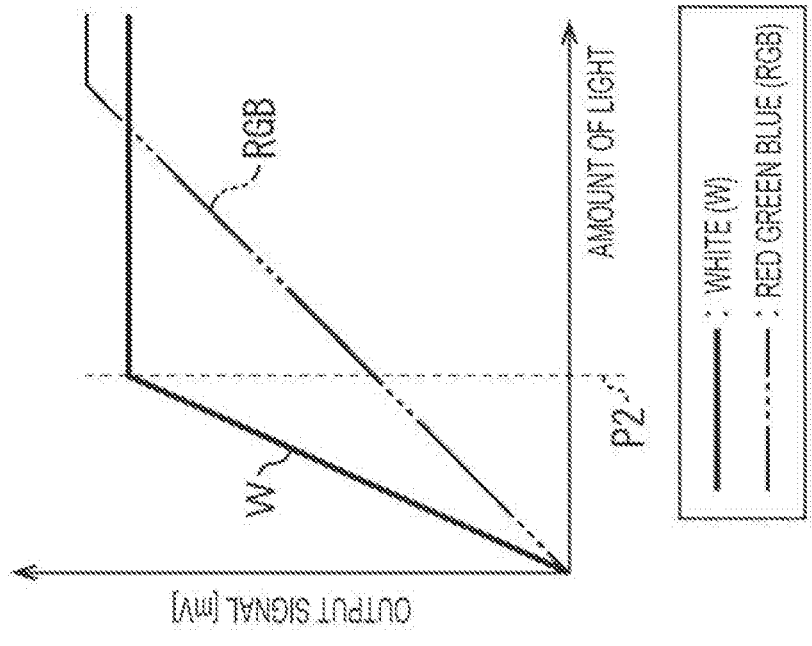
FIGS. 17A and 17B are diagrams illustrating improvement of linearity by suppressing the blooming phenomenon.
Figure 17A:
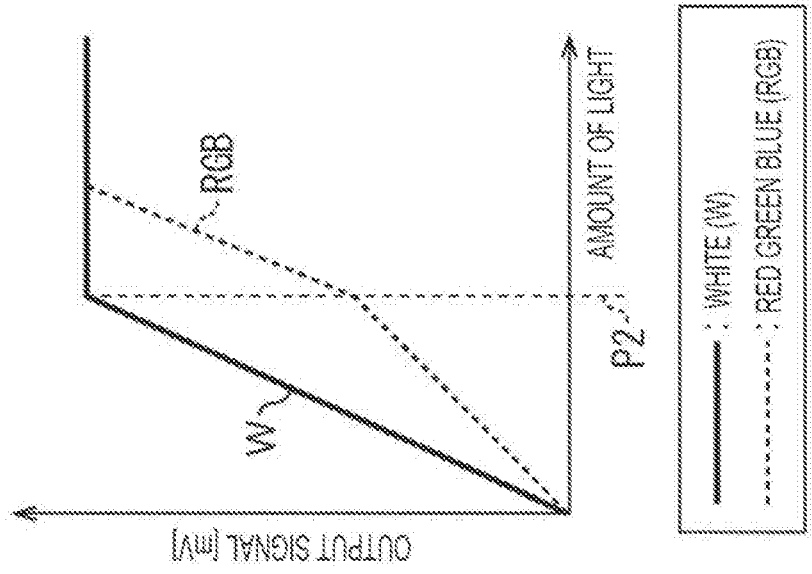

FIGS. 17A and 17B are diagrams illustrating improvement of linearity by suppressing the blooming phenomenon.

In FIG. 17A, a case is illustrated where the method for controlling the potential barrier (OFB) to which the present technology is applied is not used, for comparison, and this corresponds to the above-described conventional degradation of linearity due to the blooming phenomenon of FIG. 2. That is, in a case where the horizontal axis is an amount of light and the vertical axis is an output signal, linearity is maintained in a W pixel, but in a G pixel, an R pixel, and a B pixel, if the blooming phenomenon occurs (a dotted line P2 in the figure), linearity cannot be maintained from the middle, and linearity is degraded.

If linearity is degraded in this way, in subsequent signal processing, in an area where linearity is degraded of a high illuminance side in the G pixel, the R pixel, and the B pixel, a ratio of white balance fluctuates as compared with an area where linearity is maintained, so that coloration occurs in the shot image, as described above. Then, degradation of image quality occurs due to such coloration.

Meanwhile, FIG. 17B illustrates a case where the method for controlling the potential barrier (OFB) to which the present technology is applied is used, and the blooming phenomenon is suppressed by forming the height of the potential barrier (OFB(W)) to be deeper than the height of the potential barrier (OFB(P)), so that linearity is maintained not only in the W pixel but also in the G pixel, the R pixel, and the B pixel (linearity is improved). For that reason, in the subsequent signal processing, fluctuation of the ratio of white balance due to degradation of linearity does not occur, so that coloration does not occur in the shot image, and there is no degradation of image quality.

7. Modification

In the above-described description, the white (W) pixel has been described as a high sensitivity pixel; however, the high sensitivity pixel is not limited to an (ideal) white in a strict sense or transparent pixel, and only needs to be a pixel with higher sensitivity than a primary color pixel being a red (R) pixel, a green (G) pixel, or a blue (B) pixel, and a complementary pixel being a cyan (Cy) pixel, a magenta (Mg) pixel, or a yellow (Ye) pixel. Furthermore, in the above-described description, the R pixel, the G pixel, and the B pixel has been exemplified as chromatic color pixels; however, other chromatic color pixels may be used, for example, the Cy pixel, the Mg pixel, the Ye pixel, or the like.

Furthermore, for example, in a case where it is a pixel array not including a high sensitivity pixel (for example, the W pixel), such as a Bayer array, if, for example, the G pixel is saturated, the R pixel and the B pixel are affected by the blooming phenomenon; however, by considering the G pixel similarly to the above-described W pixel and forming the height of a potential barrier (OFB(G)) to be deeper than the height of a potential barrier (OFB(R,B)), the blooming phenomenon can be similarly avoided.

Furthermore, as the heights of a potential barrier (OFB (P)) and a potential barrier (OFB(W)) are formed to be deeper than the height of a potential barrier (B(PD)) to increase an electric potential difference from the potential barrier (B(PD)), an effect of suppressing the blooming phenomenon increases; meanwhile, an electric potential difference from each photodiode (PD) 121 decreases, so that a case is assumed where a saturation electric charge amount decreases.

That is, by forming the heights of the potential barrier (OFB(P)) and the potential barrier (OFB(W)) to be deeper to suppress the blooming phenomenon, the blooming phenomenon is suppressed and linearity is improved; however, a saturation electric charge amount (Qs) of the photodiode (PD) 121 of all pixels decreases, and a dynamic range decreases. To deal with this, for example, the photodiode 121 can be formed to accumulate sufficient electric charges in advance, or an impurity concentration can be increased to form a potential of the photodiode 121 to be deeper (to be in a + side).

8. Configuration of Camera Module

The present technology is not limited to application for a solid-state imaging apparatus. That is, besides the solid-state imaging apparatus, the present technology can be applied to all electronic apparatuses including the solid-state imaging apparatus, such as a camera module including an optical lens system and the like, an imaging apparatus such as a digital still camera or a video camera, a mobile terminal apparatus having an imaging function (for example, a smartphone or a tablet terminal), or a copying machine using the solid-state imaging apparatus for an image reading unit.

FIG. 18 is a diagram illustrating a configuration example of a camera module including the solid-state imaging apparatus.

In FIG. 18, a camera module 200 incorporates an optical lens system 211, a solid-state imaging apparatus 212, an input/output unit 213, a digital signal processor (DSP) circuit 214, and a central processing unit (CPU) 215 into one body to configure a module.

The solid-state imaging apparatus 212 corresponds to the solid-state imaging apparatus 100 of FIG. 5, and as the structure, for example, the cross-sectional structure of FIG. 6 is adopted. That is, in the solid-state imaging apparatus 212, besides an R pixel, a G pixel, and a B pixel (P pixel 111-1), a W pixel (W pixel 111-2) is arranged. The solid-state imaging apparatus 212 takes incident light (image light) from an object via the optical lens system 211, and converts an amount of incident light imaged on an imaging surface into an electrical signal for each pixel, and outputs the electrical signal as a pixel signal. The input/output unit 213 has a function as an input/output interface with the outside.

The DSP circuit 214 is a signal processing circuit for processing the signal supplied from the solid-state imaging apparatus 212. For example, in the signal processing circuit, an RGB signal based on a signal corresponding to a red (R) component from the R pixel, a signal corresponding to a green (G) component from the G pixel, and a signal corresponding to a blue (B) component from the B pixel is processed. Furthermore, a signal corresponding to a white (W) component from the W pixel is also processed. Incidentally, the processing performed by the above-described signal processing circuit may be performed by the solid-state imaging apparatus 212.

The CPU 215 performs control of the optical lens system 211 and data exchange with the input/output unit 213, and the like.

Furthermore, as a camera module 201, for example, the module may be configured by only the optical lens system 211, the solid-state imaging apparatus 212, and the input/output unit 213. In this case, the pixel signal from the solid-state imaging apparatus 212 is output via the input/output unit 213. Further, as a camera module 202, the module may be configured by only the optical lens system 211, the solid-state imaging apparatus 212, the input/output unit 213, and the DSP circuit 214. In this case, the pixel signal from the solid-state imaging apparatus 212 is processed by the DSP circuit 214, and output via the input/output unit 213.

The camera modules 200, 201, 202 are configured as described above. In the solid-state imaging apparatus 212 of each of the camera modules 200, 201, 202, between the W pixel (W pixel 111-2) as a high sensitivity pixel and the R pixel, the G pixel, and the B pixel (P pixel 111-1) as adjacent pixels of the W pixel, the height of a potential barrier (OFB(W)) is formed to be deeper than the height of a potential barrier (OFB(P)), and the blooming phenomenon is suppressed. With this configuration, coloration occurring due to the blooming phenomenon can be improved, and degradation of image quality can be suppressed.

9. Configuration of Electronic Apparatus

Figure 19:
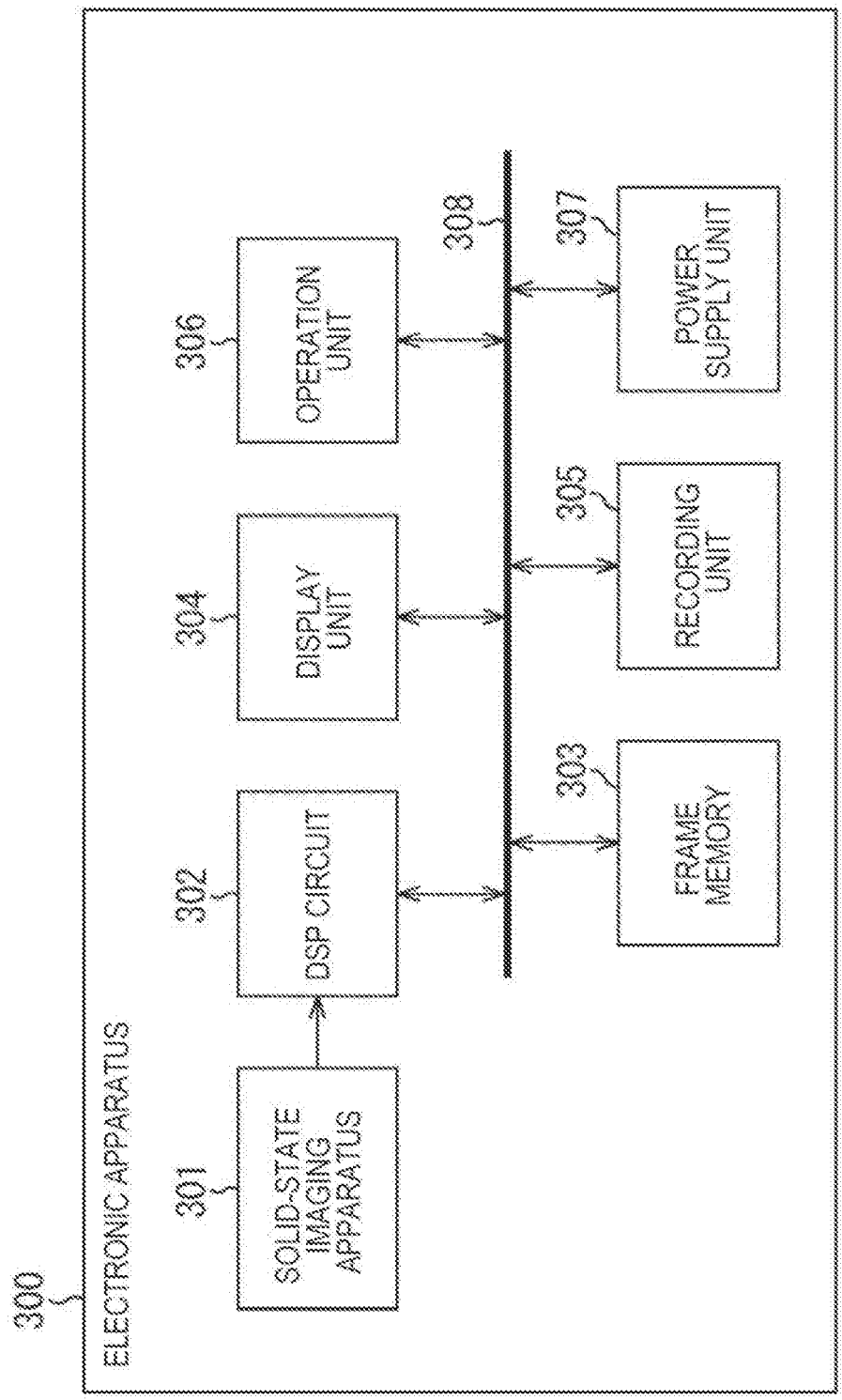
FIG. 19 is a diagram illustrating a configuration example of an electronic apparatus including a solid-state imaging apparatus.

FIG. 19 is a diagram illustrating a configuration example of an electronic apparatus including a solid-state imaging apparatus.

An electronic apparatus 300 of FIG. 19 is, for example, an electronic apparatus, such as an imaging apparatus such as a digital still camera or a video camera, or a mobile terminal apparatus such as a smartphone or a tablet terminal.

In FIG. 19, the electronic apparatus 300 includes a solid-state imaging apparatus 301, a DSP circuit 302, a frame memory 303, a display unit 304, a recording unit 305, an operation unit 306, and a power supply unit 307. Furthermore, in the electronic apparatus 300, the DSP circuit 302, the frame memory 303, the display unit 304, the recording unit 305, the operation unit 306, and the power supply unit 307 are connected to each other via a bus line 308.

The solid-state imaging apparatus 301 corresponds to the solid-state imaging apparatus 100 of FIG. 5, and as the structure, for example, the cross-sectional structure of FIG. 6 is adopted. That is, in the solid-state imaging apparatus 212, besides an R pixel, a G pixel, and a B pixel (P pixel 111-1), a W pixel (W pixel 111-2) is arranged. The solid-state imaging apparatus 301 takes incident light (image light) from an object via an optical lens system (not illustrated), and converts an amount of incident light imaged on an imaging surface into an electrical signal for each pixel, and outputs the electrical signal as a pixel signal.

The DSP circuit 302 is a signal processing circuit for processing the signal supplied from the solid-state imaging apparatus 301, and corresponds to the DSP circuit 214 of FIG. 18. The DSP circuit 302 outputs image data obtained by processing the signal from the solid-state imaging apparatus 301. The frame memory 303 temporarily holds the image data processed by the DSP circuit 302 for each frame.

The display unit 304 includes, for example, a panel type display device such as a liquid crystal panel or an organic electro-luminescence (EL) panel, and displays a moving image or a still image imaged by the solid-state imaging apparatus 301. The recording unit 305 records the image data of the moving image or the still image imaged by the solid-state imaging apparatus 301 in a recording medium such as a semiconductor memory or a hard disk.

The operation unit 306 outputs operation commands for various functions of the electronic apparatus 300, in accordance with operation by a user. The power supply unit 307 supplies various power sources being operation power sources for the DSP circuit 302, the frame memory 303, the display unit 304, the recording unit 305, and the operation unit 306, to these supply targets as appropriate.

The electronic apparatus 300 is configured as described above. In the solid-state imaging apparatus 301 of the electronic apparatus 300, between the W pixel (W pixel 111-2) as a high sensitivity pixel and the R pixel, the G pixel, and the B pixel (P pixel 111-1) as adjacent pixels of the W pixel, the height of a potential barrier (OFB(W)) is formed to be deeper than the height of a potential barrier (OFB(P)), and the blooming phenomenon is suppressed. With this configuration, coloration occurring due to the blooming phenomenon can be improved, and degradation of image quality can be suppressed.

10. Examples of Use of Solid-State Imaging Apparatus

Figure 20:
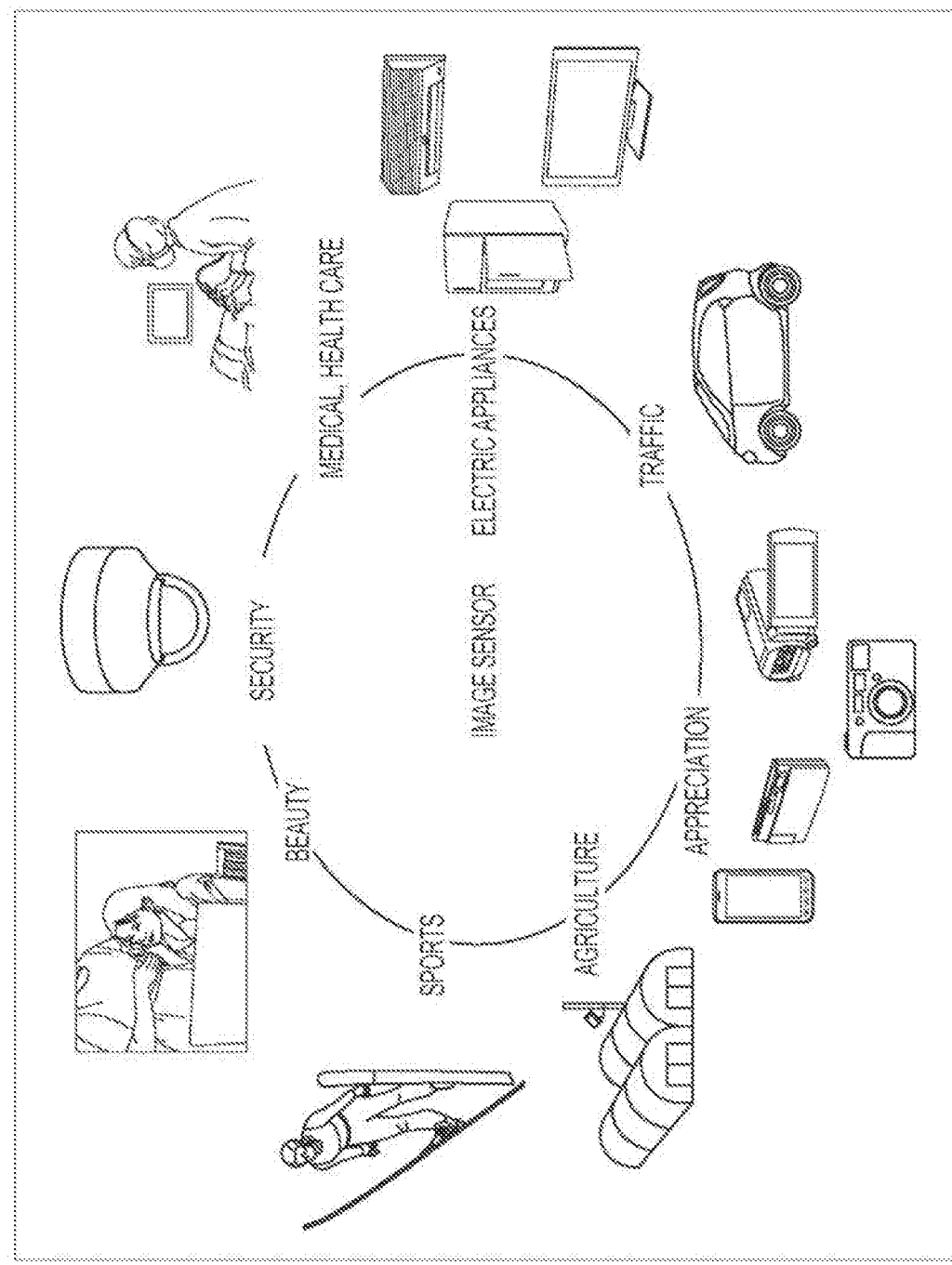
FIG. 20 is a diagram illustrating examples of use of the solid-state imaging apparatus.

FIG. 20 is a diagram illustrating examples of use of a solid-state imaging apparatus 100 as an image sensor.

The above-described solid-state imaging apparatus 100 can be used for various cases of sensing light such as visible light, infrared light, ultraviolet light, or X-rays, for example, as follows. That is, as illustrated in FIG. 20, not only in a field of appreciation in which an image to be used for appreciation is shot as described above, also in an apparatus used in a field such as a field of traffic, a field of home electric appliances, a field of medical and health care, a field of security, a field of beauty, a field of sports, or a field of agriculture, the solid-state imaging apparatus 100 can be used.

Specifically, as described above, in the field of appreciation, the solid-state imaging apparatus 100 can be used in an apparatus (for example, the electronic apparatus 300 of FIG. 19) for shooting the image to be used for appreciation, such as a digital camera, a smartphone, a mobile phone with a camera function.

In the field of traffic, for example, the solid-state imaging apparatus 100 can be used in apparatuses to be used for traffic, such as an automotive sensor for shooting ahead of, behind, around, and inside the car, a monitoring camera for monitoring traveling vehicles and roads, and a distance sensor for measuring a distance between vehicles and the like, for safe driving such as automatic stop, and recognition of driver's condition.

In the field of home electric appliances, for example, the solid-state imaging apparatus 100 can be used in apparatuses to be used for home electric appliances, such as a television receiver, a refrigerator, and an air conditioner, for shooting a user's gesture and performing apparatus operation in accordance with the gesture. Furthermore, in the field of medical and health care, the solid-state imaging apparatus 100 can be used in apparatuses to be used for medical and health care, such as an endoscope, and an apparatus for performing angiography by receiving infrared light.

In the field of security, for example, the solid-state imaging apparatus 100 can be used in apparatuses to be used for security, such as a monitoring camera for crime prevention, and a camera for person authentication. Furthermore, in the field of beauty, the solid-state imaging apparatus 100 can be used in apparatuses to be used for beauty, such as a skin measuring instrument for shooting skin, and a microscope for shooting a scalp.

In the field of sports, the solid-state imaging apparatus 100 can be used in apparatuses to be used for sports, such as an action camera for sports application, and a wearable camera. Furthermore, in the field of agriculture, the solid-state imaging apparatus 100 can be used in apparatuses to be used for agriculture, such as a camera for monitoring conditions of fields and crops, and the like.

Incidentally, the embodiment of the present technology is not limited to the embodiments described above, and various modifications are possible without departing from the scope of the present technology. For example, a mode can be adopted in which some or all of the above-described plurality of embodiments described above are combined.

Furthermore, the present technology can have a configuration as follows.

(1)

A solid-state imaging apparatus including a pixel array unit in which combinations of a first pixel corresponding to a color component of a plurality of color components and a second pixel having higher sensitivity to incident light as compared with the first pixel are two-dimensionally arrayed, in which the first pixel includes:

a first photoelectric conversion unit that generates electric charges according to an amount of incident light;

a first unnecessary electric charge drain unit that receives unnecessary electric charges being electric charges generated by the first photoelectric conversion unit; and a first unnecessary electric charge discharge gate unit that discharges the unnecessary electric charges generated by the first photoelectric conversion unit to the first unnecessary electric charge drain unit in accordance with a height of a first electrical barrier formed between the first photoelectric conversion unit and the first unnecessary electric charge drain unit, and the second pixel includes:

a second photoelectric conversion unit that generates electric charges according to an amount of incident light;

a second unnecessary electric charge drain unit that receives unnecessary electric charges being electric charges generated by the second photoelectric conversion unit; and a second unnecessary electric charge discharge gate unit that discharges the unnecessary electric charges generated by the second photoelectric conversion unit to the second unnecessary electric charge drain unit in accordance with a height of a second electrical barrier formed between the second photoelectric conversion unit and the second unnecessary electric charge drain unit, and the height of the first electrical barrier and the height of the second electrical barrier are different from each other.

(2)

The solid-state imaging apparatus according to (1), in which the height of the second electrical barrier is formed to be deeper than the height of the first electrical barrier.

(3)

The solid-state imaging apparatus according to (2), in which the height of the second electrical barrier is formed to be deeper than the height of the first electrical barrier by controlling a first voltage to be applied to the first unnecessary electric charge discharge gate unit and a second voltage to be applied to the second unnecessary electric charge discharge gate unit.

(4)

The solid-state imaging apparatus according to (2), in which the height of the second electrical barrier is formed to be deeper than the height of the first electrical barrier by controlling a first voltage to be applied to the first unnecessary electric charge drain unit and a second voltage to be applied to the second unnecessary electric charge drain unit.

(5)

The solid-state imaging apparatus according to (2) in which a gate size of the first unnecessary electric charge discharge gate unit and a gate size of the second unnecessary electric charge discharge gate unit are different from each other.

(6)

The solid-state imaging apparatus according to (2), in which a first impurity concentration near the first unnecessary electric charge discharge gate unit and a second impurity concentration near the second unnecessary electric charge discharge gate unit are different from each other.

(7)

The solid-state imaging apparatus according to any of (1) to (6), in which the first pixel further includes a first electric charge holding unit that holds electric charges generated by the first photoelectric conversion unit, and the second pixel further includes a second electric charge holding unit that holds electric charges generated by the second photoelectric conversion unit.

(8)

An electronic apparatus mounting a solid-state imaging apparatus, the solid-state imaging apparatus including a pixel array unit in which combinations of a first pixel corresponding to a color component of a plurality of color components and a second pixel having higher sensitivity to incident light as compared with the first pixel are two-dimensionally arrayed, in which the first pixel includes:

a first photoelectric conversion unit that generates electric charges according to an amount of incident light;

a first unnecessary electric charge drain unit that receives unnecessary electric charges being electric charges generated by the first photoelectric conversion unit; and a first unnecessary electric charge discharge gate unit that discharges the unnecessary electric charges generated by the first photoelectric conversion unit to the first unnecessary electric charge drain unit in accordance with a height of a first electrical barrier formed between the first photoelectric conversion unit and the first unnecessary electric charge drain unit, and the second pixel includes:

a second photoelectric conversion unit that generates electric charges according to an amount of incident light;

a second unnecessary electric charge drain unit that receives unnecessary electric charges being electric charges generated by the second photoelectric conversion unit; and a second unnecessary electric charge discharge gate unit that discharges the unnecessary electric charges generated by the second photoelectric conversion unit to the second unnecessary electric charge drain unit in accordance with a height of a second electrical barrier formed between the second photoelectric conversion unit and the second unnecessary electric charge drain unit, and the height of the first electrical barrier and the height of the second electrical barrier are different from each other.

REFERENCE SIGNS LIST

100 Solid-state imaging apparatus
101 Pixel array unit

111 Pixel
111-1 P pixel (RGB pixel)
111-2 W pixel
103 Column signal processing circuit
106 Control circuit
121, 121-1, 121-2 Photodiode (PD)
122, 122-1, 122-2 First transfer gate (TRG)
123, 123-1, 123-2 Floating diffusion (FD)
124, 124-1, 124-2 Overflow gate (OFG)
125, 125-1, 125-2 Overflow drain (OFD)
141, 141-1, 141-2 Second transfer gate (TRX)
142, 142-1, 142-2 Memory unit (MEM)
200, 201, 202 Camera module
212 Solid-state imaging apparatus
300 Electronic apparatus
301 Solid-state imaging apparatus

The invention claimed is:

1. A solid-state imaging apparatus, comprising:
a pixel array unit that includes a first pixel and a second pixel arranged two-dimensionally, wherein
the first pixel includes:
  a first photoelectric conversion region configured to generate electric charges based on a first amount of incident light;
  a first region configured to receive the electric charges generated by the first photoelectric conversion region, wherein the first region includes first impurities; and
  a first gate electrode configured to transfer the electric charges generated by the first photoelectric conversion region to the first region,
the second pixel includes:
  a second photoelectric conversion region configured to generate electric charges based on a second amount of incident light;
  a second region configured to receive the electric charges generated by the second photoelectric conversion region, wherein the second region includes second impurities; and
  a second gate electrode configured to discharge the electric charges generated by the second photoelectric conversion region to the second region, and
an impurity concentration of the first gate electrode is different from an impurity concentration of the second gate electrode.

2. The solid-state imaging apparatus according to claim 1, wherein
a height of a second electrical barrier is deeper than a height of a first electrical barrier,
the first electrical barrier is between the first photoelectric conversion region and the first region, and
the second electrical barrier is between the second photoelectric conversion region and the second region.

3. The solid-state imaging apparatus according to claim 2, wherein the height of the second electrical barrier is deeper than the height of the first electrical barrier, by control of a first voltage applied to the first gate electrode and a second voltage applied to the second gate electrode.

4. The solid-state imaging apparatus according to claim 2, wherein the height of the second electrical barrier is deeper than the height of the first electrical barrier, by control of a first voltage applied to the first region and a second voltage applied to the second region.

5. The solid-state imaging apparatus according to claim 1, wherein
the first pixel further includes a first electric charge holding unit configured to hold the electric charges generated by the first photoelectric conversion region, and
the second pixel further includes a second electric charge holding unit configured to hold the electric charges generated by the second photoelectric conversion region.

6. A solid-state imaging apparatus, comprising:
a pixel array unit that includes a first pixel and a second pixel arranged two-dimensionally, wherein
the first pixel includes:
  a first photoelectric conversion region configured to generate electric charges based on a first amount of incident light;
  a first region configured to receive the electric charges generated by the first photoelectric conversion region, wherein the first region includes first impurities; and
  a first gate electrode configured to transfer the electric charges generated by the first photoelectric conversion region to the first region,
the second pixel includes:
  a second photoelectric conversion region configured to generate electric charges based on a second amount of incident light;
  a second region configured to receive the electric charges generated by the second photoelectric conversion region, wherein the second region includes second impurities; and
  a second gate electrode configured to discharge the electric charges generated by the second photoelectric conversion region to the second region, and
a gate size of the first gate electrode is different from a gate size of the second gate electrode.

7. The solid-state imaging apparatus according to claim 1, wherein the first pixel is adjacent to the second pixel.

* * * * *